(12) United States Patent
Sai et al.

(10) Patent No.: US 10,218,364 B2
(45) Date of Patent: *Feb. 26, 2019

(54) TIME TO DIGITAL CONVERTER, PHASE DIFFERENCE PULSE GENERATOR, RADIO COMMUNICATION DEVICE, AND RADIO COMMUNICATION METHOD

(71) Applicant: KABUSHIKI KAISHA TOSHIBA, Minato-ku (JP)

(72) Inventors: Akihide Sai, Kawasaki (JP); Masanori Furuta, Odawara (JP); Tetsuro Itakura, Nerima (JP); Satoshi Kondo, Kawasaki (JP); Hidenori Okuni, Yokohama (JP); Tuan Thanh Ta, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/462,288

(22) Filed: Mar. 17, 2017

(65) Prior Publication Data

US 2017/0194972 A1 Jul. 6, 2017

Related U.S. Application Data

(63) Continuation of application No. PCT/JP2015/085747, filed on Dec. 22, 2015.

(30) Foreign Application Priority Data

Dec. 25, 2014 (JP) ................................. 2014-263385

(51) Int. Cl.
*G04F 10/00* (2006.01)
*H03K 5/24* (2006.01)
(Continued)

(52) U.S. Cl.
CPC ............ *H03L 7/099* (2013.01); *G04F 10/005* (2013.01); *H03K 5/24* (2013.01); *H03K 5/26* (2013.01);
(Continued)

(58) Field of Classification Search
CPC ....... G04F 10/005; H03L 7/093; H03L 7/099; H03L 7/0891; H03L 7/091; H03L 7/095; H03L 7/0991; H04L 7/033
See application file for complete search history.

(56) References Cited

U.S. PATENT DOCUMENTS 6,429,693 B1 8/2002 Staszewski et al.
9,804,573 B1 * 10/2017 Drost .................... G04F 10/005
(Continued)

FOREIGN PATENT DOCUMENTS

JP 2002-76886 3/2002
JP 2011-155601 8/2011
(Continued)

OTHER PUBLICATIONS

International Search Report dated Mar. 22, 2016 in PCT/JP2015/085747 filed on Dec. 22, 2015.
(Continued)

*Primary Examiner* — David B. Lugo
(74) *Attorney, Agent, or Firm* — Oblon, McClelland, Maier & Neustadt, L.L.P.

(57) ABSTRACT

A time to digital converter has a counter to measure the number of cycles of a first signal, a first phase difference detector to generate a phase difference signal having a pulse width corresponding to a phase difference, a first capacitor to be charged with an electric charge, a second capacitor including capacitance N times the capacitance of the first capacitor, the N being a real number larger than 1, a comparator to compare a charge voltage of the first capacitor
(Continued)

and a charge voltage of the second capacitor, a first charge controller to continue to charge the second capacitor until the comparator detects that the charge voltage of the second capacitor has reached the charge voltage of the first capacitor or more, and a first phase difference arithmetic unit to operate the phase difference between the first signal and the second signal.

20 Claims, 14 Drawing Sheets

(51) Int. Cl.
  *H03K 5/26*   (2006.01)
  *H03K 21/02*   (2006.01)
  *H03L 7/06*   (2006.01)
  *H03L 7/085*   (2006.01)
  *H03L 7/093*   (2006.01)
  *H03L 7/099*   (2006.01)
  *H04L 7/033*   (2006.01)

(52) U.S. Cl.
  CPC ............... *H03K 21/02* (2013.01); *H03L 7/06* (2013.01); *H03L 7/085* (2013.01); *H03L 7/093* (2013.01); *H03L 7/0992* (2013.01); *H04L 7/033* (2013.01); *H03L 2207/50* (2013.01)

(56) References Cited

U.S. PATENT DOCUMENTS

| | | | |
|---|---|---|---|
| 9,811,056 B2* | 11/2017 | Cho | ........................ G04F 10/005 |
| 2012/0100821 A1 | 4/2012 | Dan et al. | |
| 2015/0145572 A1* | 5/2015 | Sato | ........................ G04F 10/005 |
| | | | 327/159 |

FOREIGN PATENT DOCUMENTS

| | | |
|---|---|---|
| JP | 2013-168786 | 8/2013 |
| JP | 2016-181735 | 10/2016 |
| WO | WO 2011/001652 A1 | 1/2011 |

OTHER PUBLICATIONS

Robert Bogdan Staszewski, et al., "All-Digital PLL and Transmitter for Mobile Phones", IEEE Journal of Solid-State Circuits, vol. 40, (12), 2005, 7 pgs.

* cited by examiner

TIME TO DIGITAL CONVERTER, PHASE DIFFERENCE PULSE GENERATOR, RADIO COMMUNICATION DEVICE, AND RADIO COMMUNICATION METHOD

CROSS REFERENCE TO RELATED APPLICATIONS

This application is based upon and claims the benefit of priority from the prior Japanese Patent Application No. 2014-263385, filed on Dec. 25, 2014, the entire contents of which are incorporated herein by reference.

FIELD

Embodiments of the present disclosure relate to a time to digital converter, a phase difference pulse generator, a radio communication device, and a radio communication method.

BACKGROUND

A main circuit in a radio communication device is often formed by a CMOS process, for integration on a chip. For example, a local oscillation signal can be generated by an all-digitized all digital phase-locked loop (ADPLL) circuit and a time to digital converter.

A conventional time to digital converter latches each output of multi-staged inverters with a corresponding flip-flop so as to generate a phase difference signal. This type of circuit requires several-tens-staged inverters and flip-flops so that there is a problem that a circuit scale increases and additionally the consumption current of the entire time to digital converter is large.

DETAILED DESCRIPTION

A time to digital converter according to one embodiment has:

a counter to measure the number of cycles of a first signal;

a first phase difference detector to generate a phase difference signal having a pulse width corresponding to a phase difference between the first signal and a second signal having a frequency twice or more lower than the frequency of the first signal;

a first capacitor to be charged with an electric charge corresponding to the pulse width of the phase difference signal;

a second capacitor including capacitance N times the capacitance of the first capacitor, the N being a real number larger than 1;

a comparator to compare a charge voltage of the first capacitor and a charge voltage of the second capacitor;

a first charge controller to continue to charge the second capacitor until the comparator detects that the charge voltage of the second capacitor has reached the charge voltage of the first capacitor or more; and a first phase difference arithmetic unit to operate the phase difference between the first signal and the second signal, based on a value obtained by dividing a count value of the counter during a period of the charge to the second capacitor by the N.

Embodiments of the present disclosure will be described below with reference to the drawings. Distinctive configurations and operations in a time to digital converter, a phase difference pulse generator, and a radio communication device will be mainly described in the embodiments below. The time to digital converter, the phase difference pulse generator, and the radio communication device may include configurations and operations omitted in the descriptions below. Note that, the scope of the present embodiments includes the omitted configurations and operations.

First Embodiment

Figure 1:
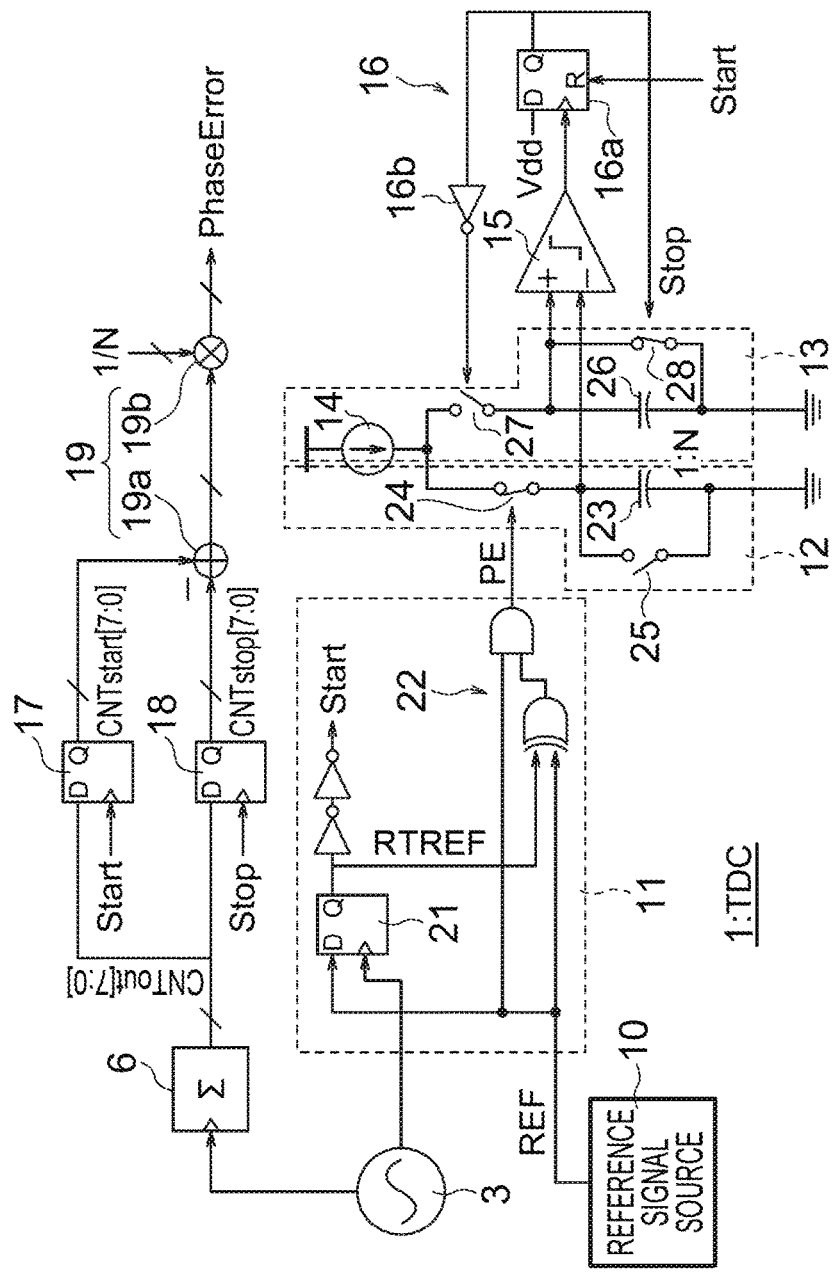
FIG. 1 is a block diagram of a schematic configuration of a TDC according to a first embodiment.
Figure 2:
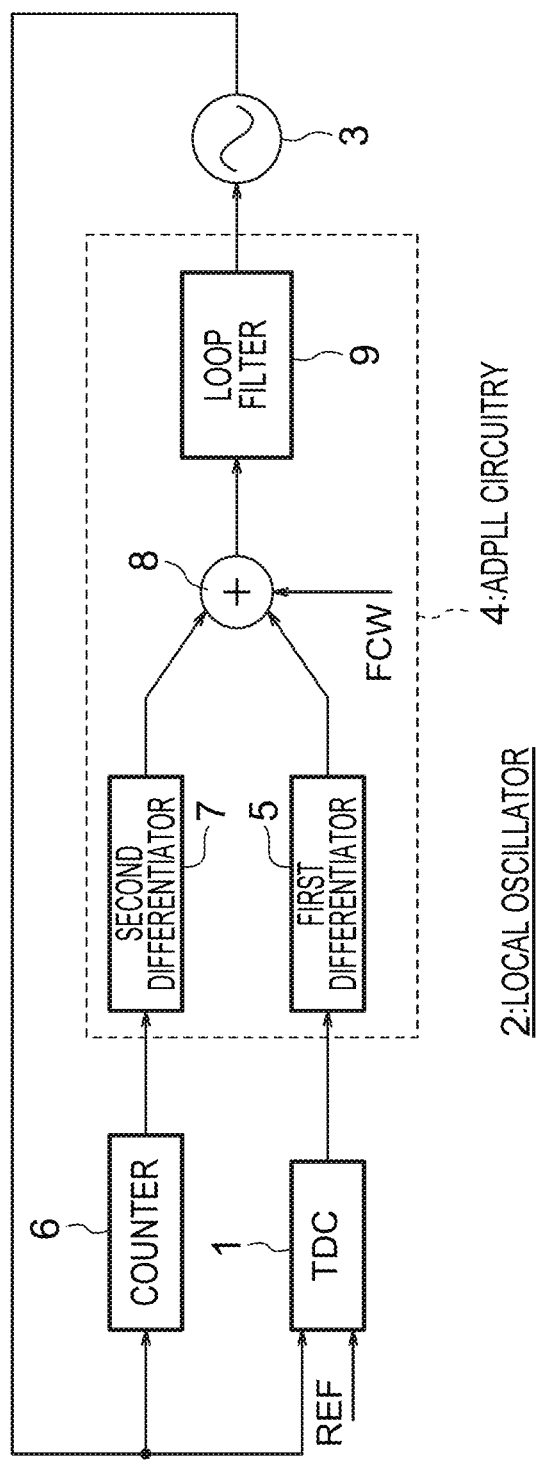
FIG. 2 is a block diagram of a schematic configuration of a local oscillator with the TDC.

FIG. 1 is a block diagram of a schematic configuration of a time to digital converter (TDC) 1 according to a first embodiment. FIG. 2 is a block diagram of a schematic configuration of a local oscillator 2 with the TDC 1.

Before the descriptions of the configuration and operation of the TDC 1 in FIG. 1, the configuration and operation of the local oscillator 2 in FIG. 2 will be described.

The local oscillator 2 in FIG. 2 is circuitry that generates a local oscillation signal to be used in a radio communication device, for example. The local oscillator 2 in FIG. 2 has a digitally controlled oscillator (DCO) 3, the TDC 1 having a detailed configuration illustrated in FIG. 1, and an ADPLL circuitry 4. The ADPLL circuitry 4 includes a first differentiator 5 that differentiates an output signal of the TDC 1, a second differentiator 7 that differentiates an output signal of a counter 6 in the TDC 1, a logic and arithmetic unit 8 that operates frequency error information, and a loop filter 9. In FIG. 2, the counter 6 is provided separately from the TDC 1, and an example of the counter 6 provided inside the TDC 1 will be described in the present specification.

The counter 6 counts the number of rising edges or falling edges of an oscillation signal of the DCO 3. The output signal of the counter 6 indicates an integral phase of the oscillation signal of the DCO 3. The second differentiator 7 performs differential processing to the output signal of the counter 6. An output signal of the second differentiator 7 indicates an integral frequency of the oscillation signal of the DCO 3.

The TDC 1 in detail illustrated in FIG. 1 generates a phase difference signal between the oscillation signal of the DCO 3 and a reference signal, as to be described below. The phase difference signal indicates a decimal phase of the oscillation signal of the DCO 3. The first differentiator 5 performs differential processing to the output signal of the TDC 1. An output signal of the first differentiator 5 indicates a decimal frequency of the oscillation signal of the DCO 3.

The logic and arithmetic unit 8 operates a signal in which the output signal of the first differentiator 5 and the output signal of the second differentiator 7 are subtracted from a frequency code FCW to be set from the external. An output signal of the logic and arithmetic unit 8 is a frequency error signal indicating the error between the frequency indicated with the frequency code FCW and the frequency of the oscillation signal of the DCO 3.

The loop filter 9 removes a noise component included in the frequency error signal. An output signal of the loop filter 9 is input to the DCO 3. The DCO 3 performs a feedback operation in order to remove the error between the frequency indicated with the frequency code FCW and the frequency of the oscillation signal of the DCO 3, based on the output signal of the loop filter 9.

Note that, the DCO 3 is provided in the local oscillator 2 in FIG. 2. Instead of the generation of the oscillation signal of the DCO 3 in the local oscillator 2, an oscillation signal generated by a voltage controlled oscillator (VCO) provided outside the local oscillator 2 may be input to the local oscillator 2.

Next, the configuration and operation of the TDC 1 will be described based on FIG. 1. The TDC 1 in FIG. 1 includes a counter 6, a phase difference detector (a first phase difference detector) 11, a first charge pump 12, a second charge pump 13, a first current source 14, a comparator 15, a charge and discharge controller (a first charge controller) 16, a first retaining unit 17, a second retaining unit 18, and a phase difference arithmetic unit (a first phase difference arithmetic unit) 19.

The counter 6 measures the number of cycles of the oscillation signal of the DCO 3 (a first signal). That is, the counter 6 measures the number of rising edges or falling edges of the oscillation signal of the DCO 3.

The phase difference detector 11 generates the phase difference signal PE between the oscillation signal of the DCO 3 and the reference signal (a second signal) REF. The reference signal REF is generated by, for example, a reference signal source 10.

The reference signal source 10 may be provided inside or outside the TDC 1. The frequency of the reference signal REF is a signal twice or more lower than the frequency of the oscillation signal of the DCO 3. The phase difference signal PE generated by the phase difference detector 11 indicates a phase difference in one cycle of the oscillation signal of the DCO 3, namely, a decimal phase difference.

In more detail, the phase difference detector 11 has a first synchronizing circuitry (DFF) 21 that generates a signal RTREF including the reference signal REF synchronized (latched) at a rising edge or falling edge of the oscillation signal of the DCO 3, and a first logic and arithmetic unit 22 that generates the phase difference signal PE indicating the phase difference between the signal RTREF and the reference signal REF. A signal START has the same logic as that of the signal RFREF.

The first charge pump 12 has a first capacitor 23, a first switch (a first selector) 24, and a second switch (a third selector) 25.

The first switch 24 switches whether the first capacitor 23 is charged by supplying a current from the first current source 14 to the first capacitor 23. When the first switch 24 is turned on, the current from the first current source 14 is supplied to the first capacitor 23 so that the first capacitor 23 is charged. The first switch 24 is turned on or off due to the phase difference signal PE output from the phase difference detector 11. For example, when the phase difference signal PE is high, the first switch 24 is turned on. When the phase difference signal PE is low, the first switch 24 is turned off.

The second switch 25 switches whether a short circuit is made between electrodes at both ends of the first capacitor 23. When the second switch 25 is turned on, the short circuit is made between the electrodes at both ends of the first capacitor 23 so that the first capacitor 23 is discharged. The second switch 25 is turned on or off due to an output signal of the charge and discharge controller 16 to be described later.

The second charge pump 13 has a second capacitor 26, a third switch (a second selector) 27, and a fourth switch (a fourth selector) 28.

The second capacitor 26 has capacitance N times that of the first capacitor 23 (N is a real number more than 1).

The third switch 27 switches whether the second capacitor 26 is charged by supplying the current from the first current source 14 to the second capacitor 26. When the third switch 27 is turned on, the current is supplied from the first current source 14 to the second capacitor 26 so that the second capacitor 26 is charged.

The fourth switch 28 switches whether a short circuit is made between electrodes at both ends of the second capacitor 26. When the fourth switch 28 is turned on, the short circuit is made between the electrodes at both ends of the second capacitor 26 so that the second capacitor 26 is discharged. The third switch 27 and the fourth switch 28 are turned on or off due to the output signal of the charge and discharge controller 16 to be described later.

The comparator 15 compares a charge voltage of the first capacitor 23 and a charge voltage of the second capacitor 26 so as to output a signal corresponding to a voltage difference between both of the charge voltages.

The charge and discharge controller 16 continues to charge the second capacitor 26 until the comparator 15 detects that the charge voltage of the second capacitor 26 has reached the charge voltage of the first capacitor 23 or more. That is, the charge and discharge controller 16 generates a first logic signal (e.g., low) when the charge voltage of the second capacitor 26 is less than the charge voltage of the first capacitor 23, and generates a second logic signal (e.g., high) when the charge voltage of the second capacitor 26 is higher than the charge voltage of the first capacitor 23. The signal generated by the charge and discharge controller 16 is used for making a switch of turning the second switch 25, the third switch 27, and the fourth switch 28 on or off.

In more detail, the charge and discharge controller 16 has a D flip-flop (hereinafter, referred to as a DFF) 16a and an inverter 16b. The output signal of the comparator 15 is input to a clock terminal of the DFF 16a, a D input terminal of the DFF 16a is set to a power source voltage Vdd, and the signal START is input to a reset terminal of the DFF 16a. The signal START is a pulse signal having a pulse width corresponding to a period during which an output signal of the DFF 21 in the phase difference detector 11 is high. When the signal START is input, the DFF 16a is reset so that the charge of the second capacitor 26 starts. A Q output signal of the DFF 16a is a signal STOP. While the signal STOP is low, the third switch 27 is on and the fourth switch 28 is off so that the second capacitor 26 is charged. When the signal STOP is turned high, the third switch 27 is off and the fourth switch 28 is on so that the second capacitor 26 is discharged. When the comparator 15 detects that the charge voltage of the second capacitor 26 has reached the charge voltage of the first capacitor 23 or more, the signal STOP is turned high. In this manner, when the charge voltage of the second capacitor 26 has reached the charge voltage of the first capacitor 23 or more, the charge of the second capacitor 26 is completed and additionally the first capacitor 23 and the second capacitor 26 are discharged.

The first retaining unit 17 retains the count value of the counter 6 at a point in time when the charge of the second capacitor 26 starts. The first retaining unit 17 has, for example, a DFF. The count value of the counter 6 is input to a D input terminal of the DFF, and the signal START is input to a clock terminal. The DFF latches (retains) the count value of the counter 6 at a rising edge of the signal START.

The second retaining unit 18 retains the count value of the counter 6 at a point in time when the comparator 15 detects that the charge voltage of the second capacitor 26 has reached the charge voltage of the first capacitor 23 or more. The second retaining unit 18 has, for example, a DFF. The count value of the counter 6 is input to a D input terminal of the DFF, and the STOP signal is input to a clock terminal.

The phase difference arithmetic unit 19 operates the phase difference between the oscillation signal of the DCO 3 and the reference signal REF. In more detail, the phase difference arithmetic unit 19 operates a decimal phase difference smaller than the one cycle of the oscillation signal of the DCO 3.

The phase difference arithmetic unit 19 has, for example, a difference arithmetic unit 19a that operates the difference between a value retained by the first retaining unit 17 and a value retained by the second retaining unit 18, and a multiplier 19b that operates a value having the difference operated by the difference arithmetic unit 19a, multiplied by 1/N.

Figure 3:
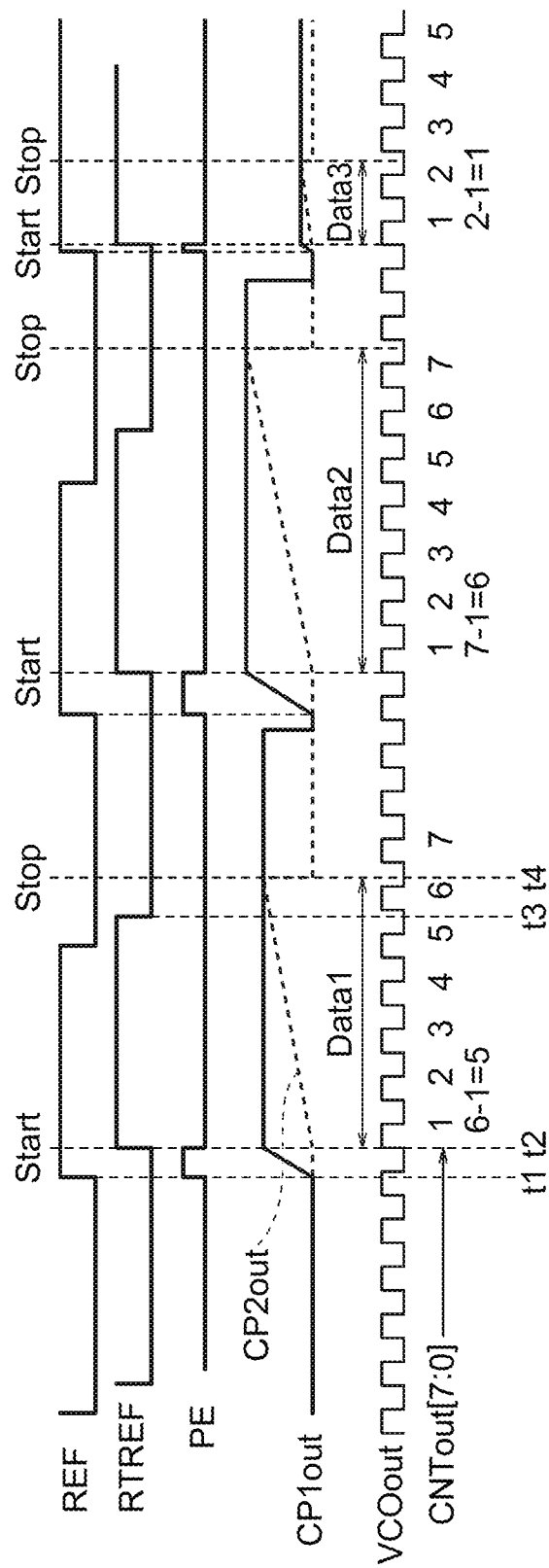
FIG. 3 is a timing chart of the TDC according to the first embodiment.

FIG. 3 is a timing chart of the TDC 1 according to the first embodiment. The operation of the TDC 1 in FIG. 1 will be described with reference to the timing chart.

First, the phase difference detector 11 detects the phase difference between the oscillation signal of the DCO 3 and the reference signal REF, and then generates the phase difference signal PE having a pulse width equivalent to the phase difference that has been detected (time t1 to t2). As illustrated in FIG. 3, the phase difference signal PE is a pulse signal having a pulse width from a rising edge of the reference signal REF to a rising edge of the signal RTREF including the reference signal REF synchronized at the rising edge of the oscillation signal of the DCO 3.

The first switch 24 in the first charge pump 12 remains on during a period during which the phase difference signal PE is high. Therefore, the first switch 24 remains on during a period between the rising edge of the reference signal REF and the rising edge of the signal RTREF (time t1 to t2). When the first switch 24 is turned on, the current is supplied from the first current source 14 to the first capacitor 23 through the first switch 24 so that the first capacitor 23 is charged. In this manner, the first capacitor 23 is charged during the period between the rising edge of the reference signal REF and the rising edge of the signal RTREF. Accordingly, as illustrated in FIG. 3, the charge voltage CP1out of the first capacitor 23 rapidly rises.

Meanwhile, the signal START varies in response to Q output of the DFF 21 in the phase difference detector 11. Therefore, the signal START rises slightly delayed with respect to the rising edge of the signal RTREF being the Q output of the DFF 21 (time t2), and then remains high until time t3.

When the signal START is turned high, Q output of the DFF 16a in the charge and discharge controller 16 is turned low, the third switch 27 is turned on, and the fourth switch 28 is turned off. Accordingly, the current flows from the first current source 14 to the second capacitor 26 through the third switch 27 in the second charge pump 13 so that the second capacitor 26 is charged (time t2 to t4).

The comparator 15 compares the charge voltage CP1out of the first capacitor 23 and the charge voltage CP2out of the second capacitor 26. When the charge voltage CP2out of the second capacitor 26 reaches the charge voltage CP1out of the first capacitor 23 or more (time t4), output of the comparator 15 varies from a low state to a high state. Accordingly, the signal STOP being the Q output of the DFF 16a in the charge and discharge controller 16 switches from a low state to a high state. When the signal STOP is turned high, the third switch 27 is turned off and the fourth switch 28 is turned on in the second charge pump 13 so that an electric charge of the second capacitor 26 is discharged.

A single-slope A/D converter includes the first charge pump 12, the second charge pump 13, and the charge and discharge controller 16. That is, as illustrated in FIG. 3, when the charge voltage CP1out of the first capacitor 23 corresponds to a voltage increasing linearly, a comparative operation is stopped. Then, the counter 6 counts a period between the start and end of the comparative operation, and the count value of the counter 6 is to be an A/D conversion value.

More specifically, the first retaining unit 17 retains the count value of the counter 6 at the rising edge of the signal START (time t2), and the second retaining unit 18 retains the count value of the counter 6 at a rising edge of the signal STOP (time t4). The difference arithmetic unit 19a operates the difference between the count value retained by the second retaining unit 18 and the count value retained by the first retaining unit 17. The difference is the count value of the counter 6 during the comparative operation of the comparator 15, and corresponds to the phase difference between the oscillation signal of the DCO 3 and the reference signal REF.

The ratio of the capacitance of the first capacitor 23 in the first charge pump 12 and the capacitance of the second capacitor 26 in the second charge pump 13 is 1:N. The maximum of the discharge period of the first capacitor 23 is the one cycle of the oscillation signal of the DCO 3. Time necessary for charging the second capacitor 26 is N times that of the first capacitor 23. Therefore, the maximum of the charge period of the second capacitor 26 corresponds to N cycles of the oscillation signal of the DCO 3. A value including the difference operated by the difference arithmetic unit 19a divided by N is a digital value corresponding to the decimal phase difference of the oscillation signal of the DCO 3, namely, the phase difference between the oscillation signal of the DCO 3 and the reference signal REF when a full-scale value of phase is defined as $2\pi$.

The multiplier 19b multiplies the difference operated by the difference arithmetic unit 19a, by 1/N so as to acquire the decimal phase difference. As described above, N is the ratio of the capacitance of the first capacitor 23 and the capacitance of the second capacitor 26. The ratio N corresponds to the full-scale value $2\pi$ of the phase difference between the oscillation signal of the DCO 3 and the reference signal REF so that the decimal phase difference between the oscillation signal of the DCO 3 and the reference signal REF can be simply operated by dividing the count value of the counter 6 by N.

FIG. 3 illustrates a timing waveform corresponding to three cycles of the reference signal REF. For example, the phase difference between the oscillation signal of the DCO 3 and the reference signal REF in a first cycle of the reference signal REF indicates the following expression, i.e. 6−1=5, the phase difference in a second cycle indicates the following expression, i.e. 7−1=6, and the phase difference in a third cycle indicates the following expression, i.e. 2−1=1. The decimal phase difference is a value of each phase difference divided by N. As illustrated in FIG. 3, when the phase difference is smaller, the pulse width of the phase difference signal PE becomes narrower so that the period between the start and end of the comparative operation of the comparator 15 shortens.

In this manner, according to the first embodiment, the first capacitor 23 is first charged in an amount of the pulse width of the phase difference signal PE indicating the phase difference between the oscillation signal of the DCO 3 and the reference signal REF. Then, the second capacitor 26 is charged so as to be equivalent to the charge voltage CP1out of the first capacitor 23, and the phase difference is detected based on the count value of the counter 6 during the period during which the second capacitor 26 is charged. The decimal phase difference between the oscillation signal of the DCO 3 and the reference signal REF is detected based on a value of the phase difference divided by the ratio N of the capacitance of the first capacitor 23 and the capacitor of the second capacitor 26. Accordingly, a large number of inverters and flip-flops that each latch output of a corresponding staged inverter, are not required to be provided inside the TDC 1 so that a circuit scale can be reduced and power consumption can be considerably reduced.

The counter 6 for detecting the integral phase, is provided in TDC 1. By using the counter 6, the decimal phase difference is detected so that there is no need to provide a counter for detecting the decimal phase. Thus, the reduction of the circuit scale and the low power consumption can be further achieved.

The single-slope A/D converter is provided in the TDC 1 and additionally the first charge pump 12 and the second charge pump 13 in the A/D converter share the first current source 14. Thus, there is no need to provide a current source to each of the charge pumps 12 and 13 so that the circuit scale can be reduced. Additionally, no variation occurs between the currents flowing through the respective charge pumps 12 and 13 so that A/D conversion accuracy can improve.

The ratio N of the capacitance of the first capacitor 23 in the first charge pump 12 and the capacitance of the second capacitor 26 in the second charge pump 13 is the full-scale value of the phase difference so that the decimal phase difference can be simply operated by only dividing the counter value of the counter 6 by N. Accordingly, no calibration processing for detecting the full-scale value of the phase difference is required so that the reduction of the circuit scale and the low power consumption can be further achieved.

Second Embodiment

A second embodiment relates to a phase difference pulse generator applicable as a phase difference detector 11 in a TDC 1.

Figure 4:
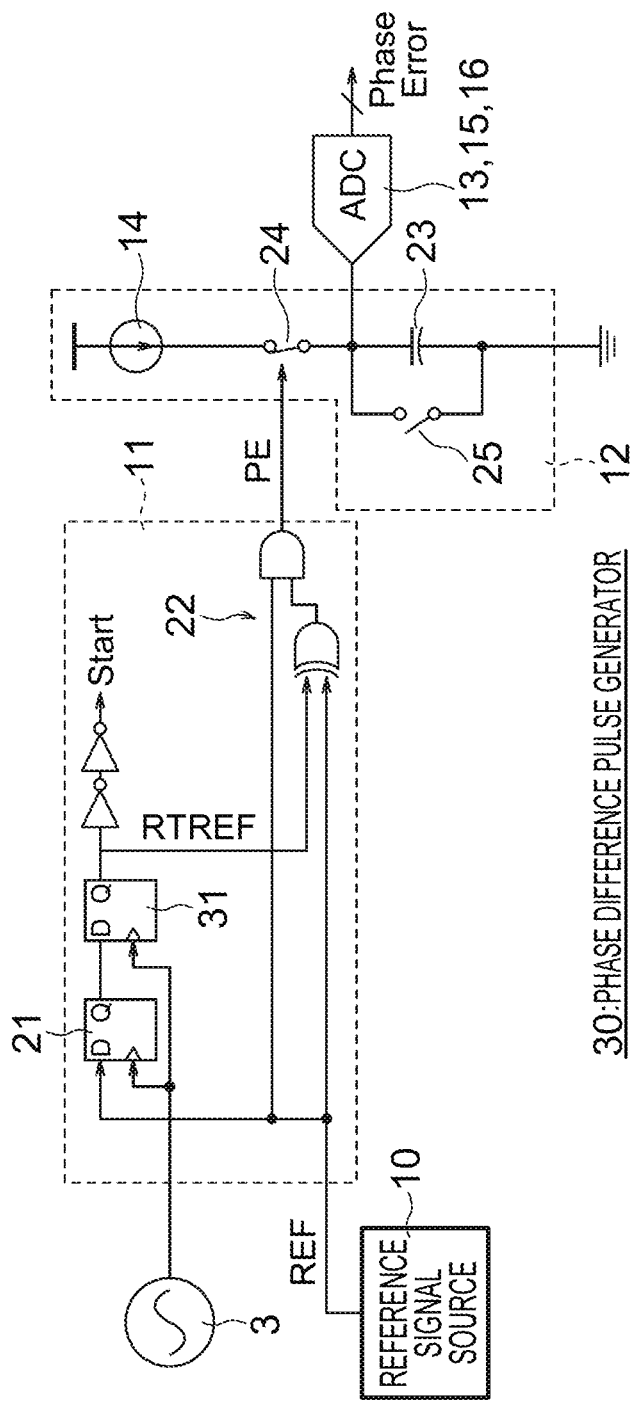
FIG. 4 is a block diagram of an internal configuration of a phase difference pulse generator according to a second embodiment.
Figure 5:
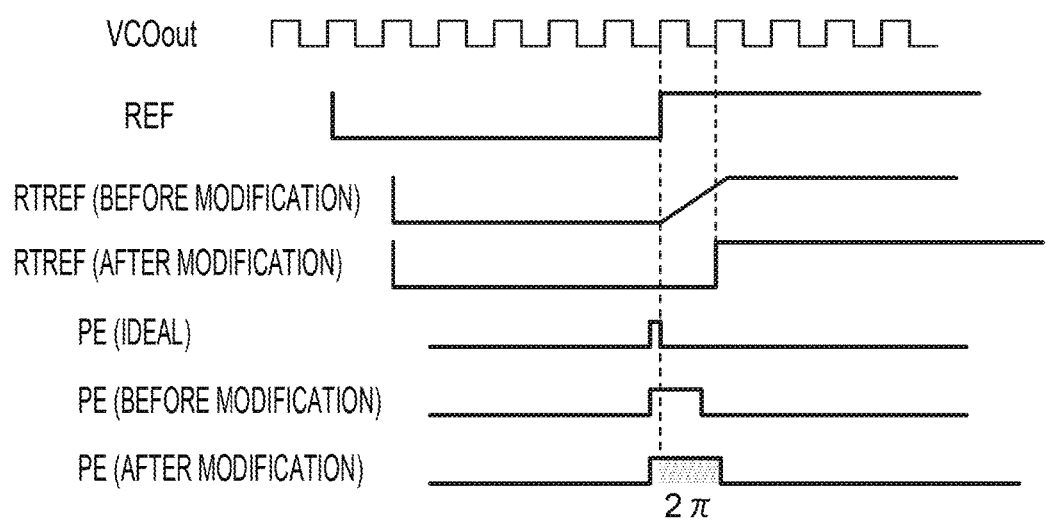
FIG. 5 is a timing chart of the phase difference pulse generator of FIG. 4.

FIG. 4 is a block diagram of an internal configuration of the phase difference pulse generator 30 according to the second embodiment. FIG. 5 is a timing chart of the phase difference pulse generator 30 of FIG. 4. The phase difference pulse generator 30 of FIG. 4 includes an m-staged DFF (a second synchronizing circuitry) 31 (m is an integer of 1 or more) coupled in series to a subsequent stage of the DFF 21 in the phase difference detector 11 in FIG. 1. An example of a single-staged DFF 31 provided is illustrated in FIG. 4, but at-least-two-staged DFF 31 may be coupled in series.

The phase difference detector 11 in FIG. 1 inputs the Q output signal RTREF of the DFF 21 to a first logic and arithmetic unit 22, whereas a Q output signal of a DFF at a last stage in the m-staged DFF 31 is defined as a signal RTREF so that the signal RTREF is input to the first logic and arithmetic unit 22 in FIG. 4.

Similarly to FIG. 1, the first logic and arithmetic unit 22 generates a phase difference signal PE to be high between a rising edge of a reference signal REF and a rising edge of the signal RTREF, based on the signal RTREF and the reference signal REF. The phase difference signal PE is used for making a switch of turning a first switch 24 on or off in a first charge pump 12, similarly to FIG. 1.

The reason why the m-staged DFF 31 is coupled in series to the subsequent stage of the DFF 21 that synchronizes the reference signal REF with an oscillation signal of a DCO 3 is that the reference signal REF and the oscillation signal of the DCO 3 are in asynchronization and the DFF 21 possibly performs a retaining operation without satisfying determined setup time and hold time in performing the latch operation by the DFF 21 so that there is a risk that the Q output signal of the DFF 21 becomes a metastable state. Accordingly, in a circuitry of FIG. 4, the m-staged DFF 31 is coupled in series to the subsequent stage of the DFF 21 and the latch operation is repeated with a clock signal having timing the same as that of the DFF 21 (in this case, the oscillation signal of the DCO 3) so that distortion of a waveform of the Q output signal of the DFF 31 is inhibited. For example, when the following expression is satisfied: m=1, the DFFs 21 and 31 totally including two stages, are coupled in series. When the Q output signal of the DFF 31 being at a second stage is still in a metastable state, another DFF 31 is further added so that the metastable state further barely occurs. Note that, as illustrated in FIG. 5, every time the number of ms increases by one, the pulse width of the phase difference signal PE increases by $2\pi$, namely, one cycle of the oscillation signal of the DCO 3. Therefore, when the phase difference signal PE generated by the phase difference pulse generator 30 in FIG. 4 is used in the TDC 1 in FIG. 1 and then the decimal phase difference is detected, for example, processing of removing, as a DC offset, the pulse width of the phase difference signal PE in an amount of the increase, is required after A/D conversion.

In this manner, according to the second embodiment, even when the Q output signal of the DFF 21 that synchronizes the reference signal REF at a rising edge or falling edge of the oscillation signal of the DCO 3, becomes in the metastable state, the m-staged DFF 31 is coupled in series to the subsequent stage of the DFF 21 so that the waveform of the Q output signal of the DFF at the last stage can be made steep. Therefore, even when the oscillation signal of the DCO 3 and the reference signal REF are in asynchronization, the phase difference signal PE accurately based on the phase difference between the reference signal REF and the oscillation signal of the DCO 3, can be generated.

Third Embodiment

According to a third embodiment to be described below, the phase difference pulse generator 30 described in the second embodiment is used as a phase difference detector 11 in a TDC 1.

Figure 6:
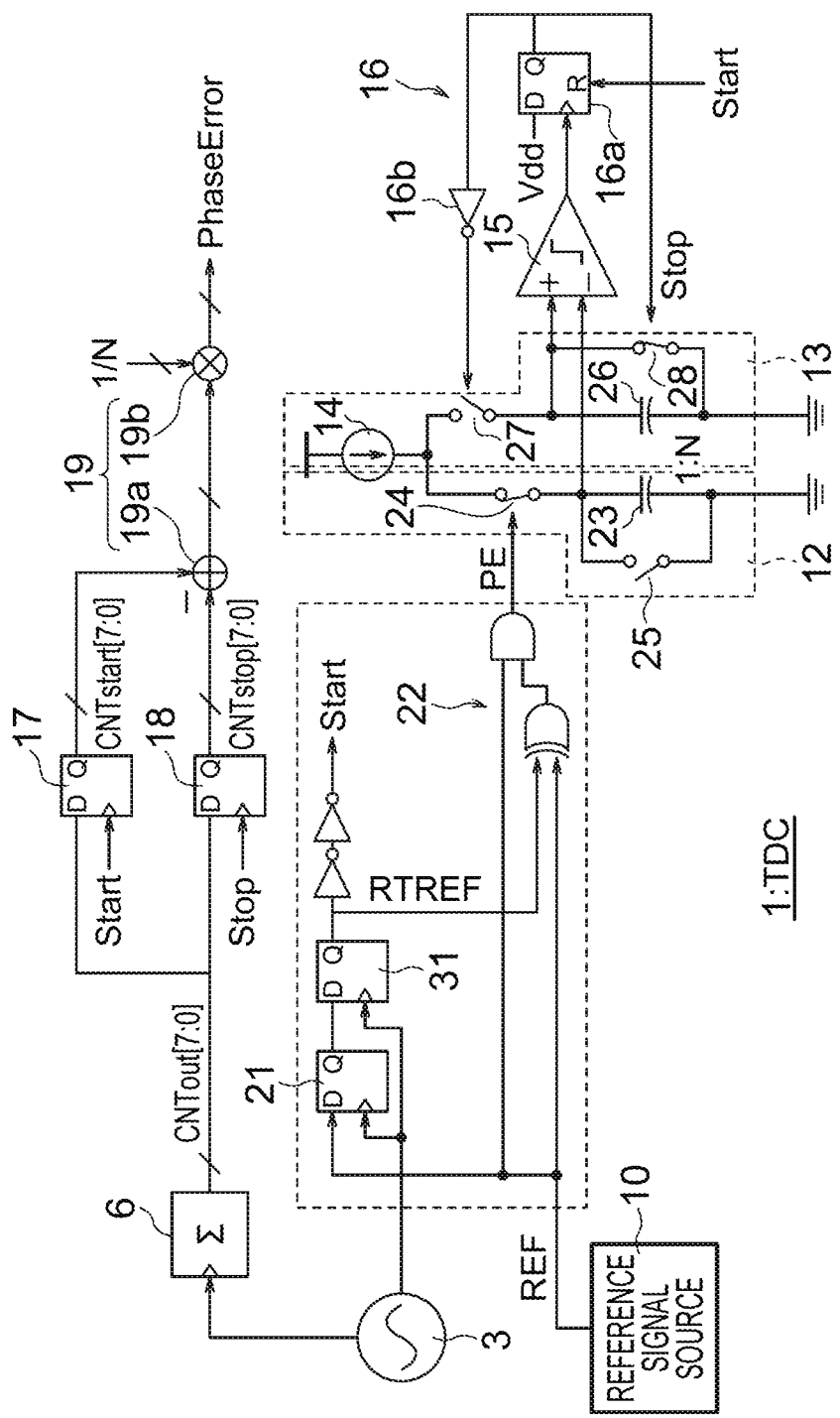
FIG. 6 is a block diagram of an internal configuration of a TDC according to a third embodiment.

FIG. 6 is a block diagram of an internal configuration of the TDC 1 according to the third embodiment. The TDC 1 in FIG. 6 includes the phase difference pulse generator 30 in FIG. 4 replaced with the phase difference detector 11 in the TDC 1 of FIG. 1. A phase difference signal PE generated by a phase difference detector 11 in FIG. 6 has a pulse width corresponding to the number of stages of an m-staged DFF 31. Providing the m-staged DFF 31 prevents a Q output signal RTREF of a DFF at a last stage in the m-staged DFF 31 from being in a metastable state even when a reference signal REF and an oscillation signal of a DCO 3 are in asynchronization so that a waveform of the phase difference signal PE can be made to have a steep pulse signal.

Every time the number of the DFFs increases by one stage, the pulse width of the phase difference signal PE increases by 2π, namely, one cycle of the oscillation signal of the DCO 3. Accordingly, charge time of a first capacitor 23 in a first charge pump 12 also corresponds to the number of stages in the m-staged DFF 31. Charge time of a second capacitor 26 in a second charge pump 13 also corresponds to the number of stages in the m-staged DFF 31. The count value of the counter 6 also increases in response to the number of stages in the m-staged DFF 31. A difference count value operated by a difference arithmetic unit 19a is a value including the count value in an amount of the m-staged DFF 31 added to the count value in an amount of an original phase difference. A one-staged DFF corresponds to the one cycle of the oscillation signal of the DCO 3.

Therefore, when the m-staged DFF 31 is coupled in series, the difference arithmetic unit 19a outputs the value having a count value in an amount of m cycles added.

In this manner, when the m-staged DFF 31 is coupled in series in the phase difference detector 11, a phase difference output from the TDC 1 includes the oscillation cycle of the DCO 3×m/N, added to an original decimal phase difference.

As illustrated in FIG. 2, the local oscillator 2 includes the first differentiator 5 coupled to a subsequent stage of the TDC 1. Thus, the first differentiator 5 performs differential processing to an output signal of the TDC 1 so that the value added to the original decimal phase difference is removed and then an original decimal frequency is acquired.

Even when the output of the TDC 1 includes the oscillation cycle of the DCO 3×m/N, the ADPLL circuitry 4 can perform phase locked processing. Therefore, even when the decimal phase difference added with the value in the amount of the m-staged DFF 31 is output from the TDC 1, nothing specifically interferes in performing the phase locked control of the ADPLL circuitry 4.

In this manner, according to the third embodiment, the m-staged DFF 31 is coupled in series to a subsequent stage of a DFF 21 that synchronizes the reference signal REF at a rising edge or falling edge of the oscillation signal of the DCO 3 in the phase difference detector 11. Thus, the Q output signal of the DFF at the last stage in the m-staged DFF 31 is prevented from being in the metastable state so that the pulse of the phase difference signal PE has a steep waveform. Therefore, the phase difference between the oscillation signal of the DCO 3 and the reference signal REF can be accurately detected.

Fourth Embodiment

According to a fourth embodiment to be described below, a charge pump operation in a second charge pump 13 is accelerated.

According to the third embodiment, the m-staged DFF 31 is provided in the phase difference detector 11 so that the pulse width of the phase difference signal PE increases in the amount of the m-staged DFF 31. Every time m increases by one, the pulse width of the phase difference signal PE increases by the one cycle of the oscillation signal of the DCO 3. Every time m increases, a charge voltage CP1out of the first capacitor 23 increases. As a result, time necessary for causing a charge voltage CP2out of the second capacitor 26 to be equivalent to the charge voltage CP1out of the first capacitor 23, lengthens so that it takes time to detect the phase difference.

This means a dynamic range for a single-slope A/D converter, namely, a dynamic range of the TDC 1 decreases. A measure against the problem is provided to the fourth embodiment.

Figure 7:
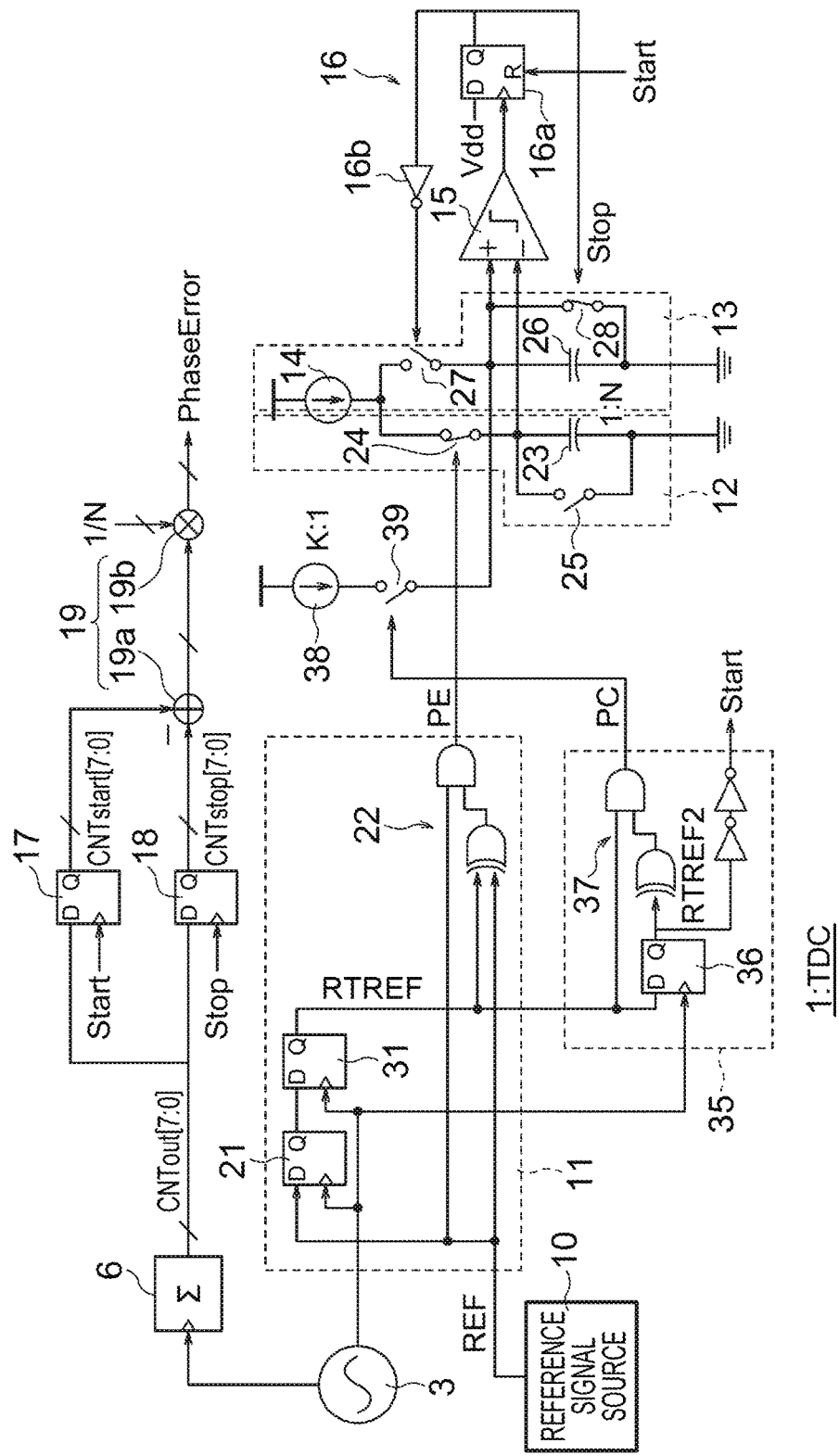
FIG. 7 is a block diagram of an internal configuration of a TDC according to a fourth embodiment.
Figure 8:
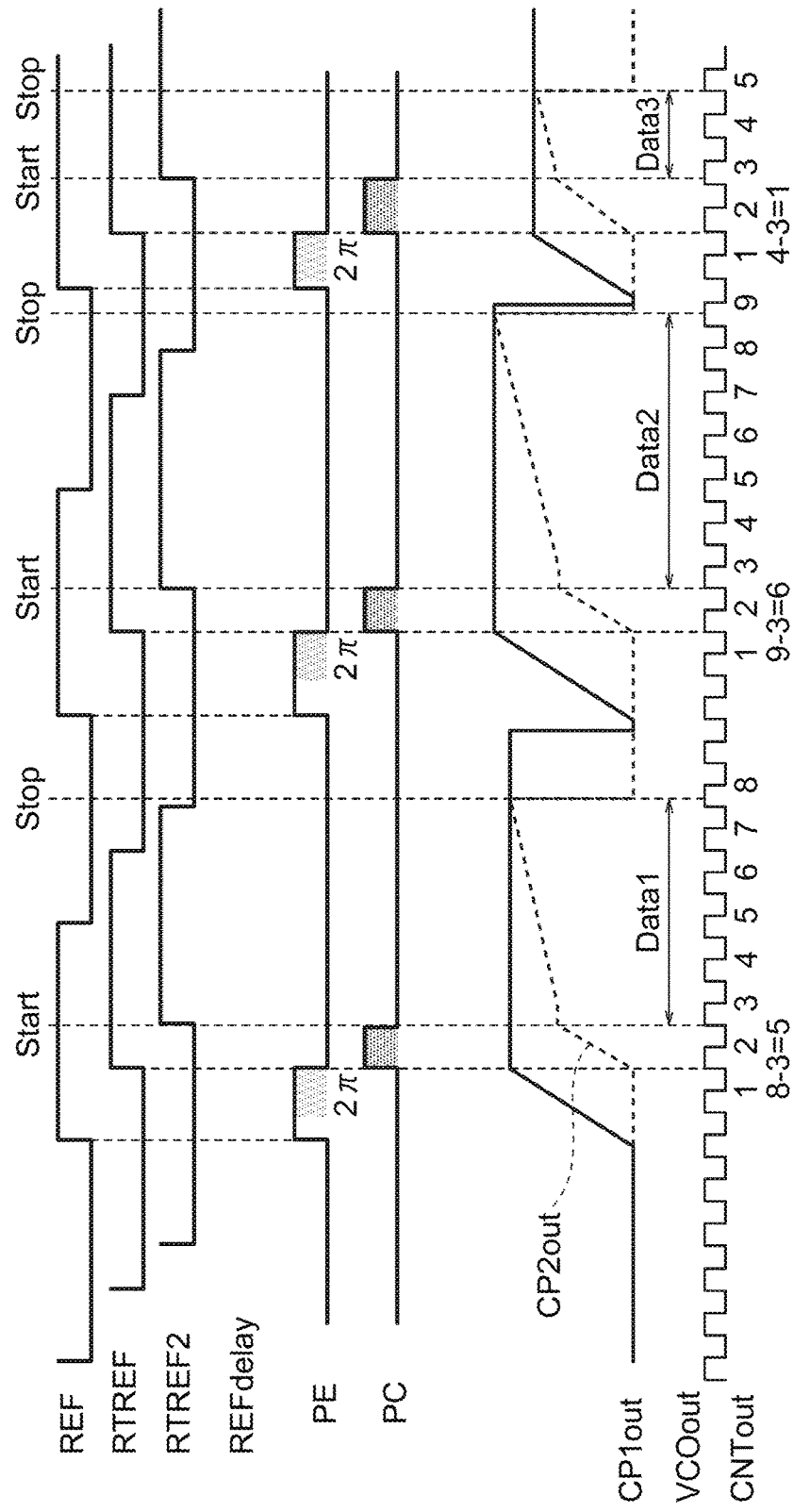
FIG. 8 is a timing chart of the TDC of FIG. 7.

FIG. 7 is a block diagram of an internal configuration of a TDC 1 according to the fourth embodiment. FIG. 8 is a timing chart of the TDC 1 of FIG. 7. The TDC 1 in FIG. 7 includes a precharge signal generator 35 added to the TDC 1 of FIG. 6. The precharge signal generator 35 generates a precharge signal having a pulse width corresponding to time necessary for passing a reference signal REF through an m-staged DFF 31.

The precharge signal generator 35 in FIG. 7 has an m-staged DFF (a third synchronizing circuitry) 36 coupled in series, and a second logic and arithmetic unit 37. The m-stage DFF 36 includes the same number of DFFs as that in the m-staged DFF 31 in a phase difference detector 11, the DFFs being coupled in series. In FIG. 7, the following expression is satisfied: m=1, but m may be at least two. The number of stages m in the DFF 36 is the same as the number of stages m in DFF 31 in the phase difference detector 11.

The m-staged DFF 36 synchronizes (latches) an output signal of a DFF 21 or an output signal of a DFF at a front stage in the phase difference detector 11, with an oscillation signal of a DCO 3. Accordingly, a DFF at a last stage in the m-staged DFF 36 outputs a signal RTREF2 having a phase delayed by m× the oscillation cycle of the DCO 3, with respect to a phase difference signal PE. In FIG. 7, the following expression is satisfied: m=1 so that the signal RTREF2 is a signal delayed by one cycle of the oscillation signal of the DCO 3 (2π), with respect to the phase difference signal PE.

The second logic and arithmetic unit 37 in the precharge signal generator 35 generates a pulse signal PC having a pulse width from a falling edge of the phase difference signal PE to a rising edge of the signal RTREF2. A signal including the signal RTREF2 delayed by even-staged inverters, is a signal START.

The TDC 1 in FIG. 7 includes a second current source 38 and a fifth switch 39. The fifth switch 39 is turned on or off with the pulse signal PC generated by the precharge signal generator 35. More specifically, when the pulse signal PC is turned on, the fifth switch 39 is turned on. When the pulse signal PC is turned off, the fifth switch 39 is turned off.

When the fifth switch 39 is turned on, a current flows from the second current source 38 to a second capacitor 26 in the second charge pump 13. Therefore, a preliminary charge, namely, a precharge of the second capacitor 26 is performed during a period during which the pulse signal PC is high.

When the preliminary charge of the second capacitor 26 is completed, the signal START is turned high and a Q output signal of a DFF 16a in the charge and discharge controller 16 is turned low. Then, a third switch 27 is turned on and the fourth switch 28 is turned off so that the second capacitor 26 is charged in the second charge pump 13.

The ratio of a current flowing from the first current source 14 and the current flowing from the second current source 38 is 1:K (1<K<N). For example, when the following expression is satisfied: K≥N, the charge voltage CP2out of the second capacitor 26 reaches the charge voltage CP1out of the first capacitor 23 or more during a period of the preliminary charge. Thus, A/D conversion is not appropriately performed and the expression is unfavorable. When the following expression is satisfied: K≤1, time necessary for completing a comparative operation of a comparator 15 further lengthens in comparison to a case where the precharge signal generator 35 is not provided, so that the expression is unfavorable.

As can be seen from a waveform of the charge voltage CP2out of the second capacitor 26 in FIG. 8, providing the precharge signal generator 35 can shortens the time necessary for completing the comparative operation of the comparator 15 so that a decimal phase difference between the oscillation signal of the DCO 3 and the reference signal REF can be detected with precision in a short time.

In this manner, according to the fourth embodiment, even when the pules width of the phase difference signal PE increases due to the provision of the m-staged DFF 31 in the phase difference detector 11, the precharge signal generator 35 preliminarily charges the second capacitor 26, in an amount of the increase of the pulse width of the phase difference signal PE. Thus, the time necessary for the comparative operation of the comparator 15 can shorten so that the phase difference between the oscillation signal of the DCO 3 and the reference signal REF can be promptly and accurately detected.

Fifth Embodiment

According to the first to fourth embodiments, the decimal phase difference of the oscillation signal of the DCO 3 can be detected more precisely as the ratio N of the capacitance of the second capacitor 26 to the capacitance of the first capacitor 23 increases. However, when the value of the N is larger, the count number of the counter 6 increases so that the time necessary for detecting the decimal phase difference lengthens and additionally the power consumption increases. According to a fifth embodiment to be described below, a decimal phase difference can be detected with a small count number with high precision, and prompt processing and a reduction of power consumption are achieved.

Figure 9:
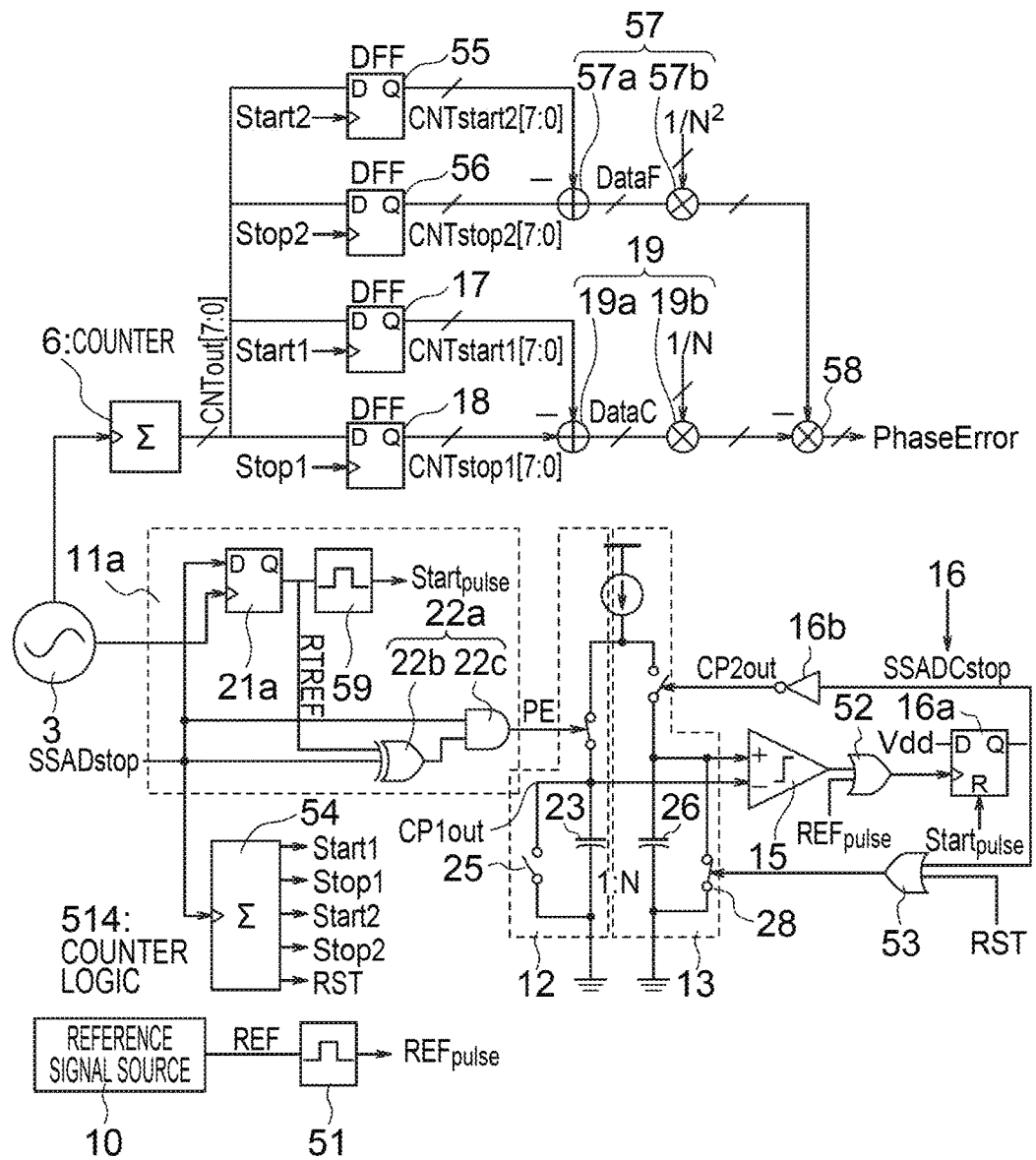
FIG. 9 is a block diagram of a schematic configuration of a TDC according to a fifth embodiment.

FIG. 9 is a block diagram of a schematic configuration of a TDC 1 according to the fifth embodiment. In FIG. 9, components shared in FIG. 1 are denoted with the same reference signs, and differences will be mainly described below. The TDC 1 in FIG. 9 has a phase difference detector (a first phase difference detector or a second phase difference detector) 11a, a reference signal source 10, a pulse generator 51, a first charge pump 12, a second charge pump 13, a comparator 15, a charge and discharge controller (a first charge controller or a second charge controller) 16, a counter logic unit 54, a DFF 17, a DFF 18, a first phase difference arithmetic unit 19, a DFF 55, a DFF 56, a second phase difference arithmetic unit 57, and a third phase difference arithmetic unit 58.

The charge and discharge controller 16 has an OR gate 52, a DFF 16a, an OR gate 53, and an inverter 16b.

The phase difference detector 11a in the TDC 1 has a configuration partially different from that of the phase difference detector 11 in FIG. 1. The phase difference detector 11a has the second phase difference detector including a DFF 21a, a pulse generator 59, and a first logic and arithmetic unit 22a. The second phase difference detector generates a phase difference signal (a signal PE) having a pulse width corresponding to the phase difference between an oscillation signal of a DCO 3 and a reference signal REF at a point in time when the comparator 15 detects that the charge voltage of a second capacitor 26 has reached the charge voltage of a first capacitor 23 or more due to continuation of a charge to the second capacitor 26.

The DFF 21a generates and outputs a signal including a signal SSADCstop latched at a rising edge of the oscillation signal of the DCO 3 (hereinafter, referred to as a signal RTREF). The signal SSADCstop will be described later.

The pulse generator 59 generates and outputs a pulse signal having a predetermined width (hereinafter, referred to as a signal STARTpulse), in synchronization with a rising edge of the signal RTREF.

The first logic and arithmetic unit 22a has an EXOR gate 22b and an AND gate 22c. The EXOR gate 22b generates and outputs a signal of an exclusive disjunction between the signal RTREF and the signal SSADCstop. The AND gate 22c generates and outputs the signal PE being a conjunction between the signal SSADCstop and an output signal of the EXOR gate 22b.

The charge and discharge controller 16 has a function of the second charge controller that continues to charge the second capacitor 26 until the comparator 15 again detects that the charge voltage of the second capacitor 26 has reached the charge voltage of the first capacitor 23 or more after the first capacitor 23 is charged based on the pulse width of the signal PE detected by the second phase difference detector described above.

The OR gate 52 generates a signal of a disjunction between an output signal of the comparator 15 and a signal REFpulse. The DFF 16a latches a power source voltage Vdd at a rising edge of the OR gate 52 so as to generate the signal SSADCstop. The DFF 16a resets the signal SSADCstop when the signal STARTpulse is turned high. The OR gate 53 generates and outputs a signal of a disjunction between the signal SSADCstop and a signal RST. When an output signal of the OR gate 53 is turned high, a fourth switch 28 is turned on so that the second capacitor 26 is discharged. The signal RST outputs a positive pulse every third rising edge of the signal SSADCstop.

The counter logic unit 54 counts the number of pulses of the signal SSADCstop, and then turns a signal START1, a signal STOP1, a signal START2, and a signal STOP2 high in this order in response to the number that has been counted. The counter logic unit 54 generates the signal RST described above.

The DFF 17 latches the count value of the counter 6 that counts an integral phase, at a rising edge of the signal START1. The DFF 18 latches the count value of the counter 6 at a rising edge of the signal STOP1. The DFF 55 latches the count value of the counter 6 at a rising edge of the signal START2. The DFF 56 latches the count value of the counter 6 at a rising edge of the signal STOP2.

A difference arithmetic unit 19a in the first phase difference arithmetic unit 19 operates a difference value between the count value retained by the DFF 18 and the count value retained by the DFF 17. A multiplier 19b operates a value obtained by multiplying the difference value output from the difference arithmetic unit 19a by 1/N.

The DFF 55 latches the count value of the counter 6 at the rising edge of the signal START2. The DFF 56 latches the count value of the counter 6 at the rising edge of the signal STOP2.

A difference arithmetic unit 57a in the second phase difference arithmetic unit 57 operates a difference value between the count value retained by the DFF 56 and the count value retained by the DFF 55. A multiplier 57b operates a value obtained by multiplying the difference value output from the difference arithmetic unit 57a by $1/N^2$.

The third phase difference arithmetic unit 58 operates and outputs a difference between the value output from the multiplier 19b and the value output from the multiplier 57b. An output signal of the third phase difference arithmetic unit 58 is a signal PhaseError indicating the decimal phase difference.

Figure 10:
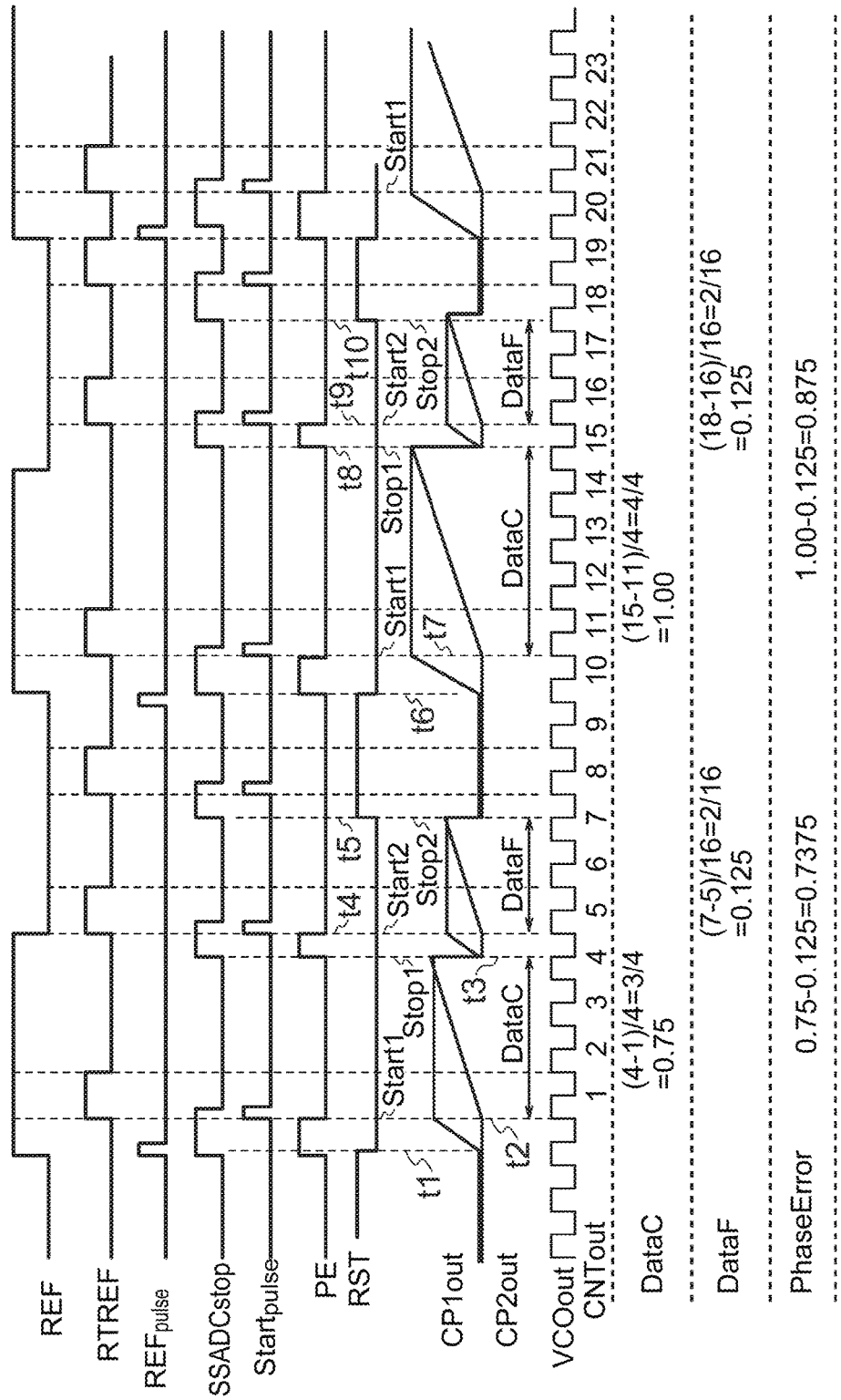
FIG. 10 is a timing chart of the TDC according to the fifth embodiment.

FIG. 10 is a timing chart of the TDC 1 according to the fifth embodiment. The signal PE indicating the phase difference between the reference signal REF and the oscillation signal of the DCO 3 is turned high between time t1 and time t2 so that the first capacitor 23 is charged during the period. After that, the second capacitor 26 is charged between time t2 and time t3. At time t3, the charge voltage of the first capacitor 23 and the charge voltage of the second capacitor 26 correspond to each other so that the output of the comparator 15 is inverted and the signal SSADCstop is turned high.

According to the present embodiment, the ratio N of the capacitance of the second capacitor 26 to the capacitance of the first capacitor 23 is smaller than those according to the first to fourth embodiments, and, for example, the following expression is satisfied: N=4. Therefore, the output of the comparator 15 is inverted in a relatively short time. Accordingly, the signal PE is turned high again between time t3 and time t4 so that the first capacitor 23 is charged again during the period. The second capacitor 26 is charged between time t4 and time t5. At time t5, the charge voltage of the first capacitor 23 and the charge voltage of the second capacitor 26 correspond to each other again so that the output of the comparator 15 is inverted again. In this case, the signal RST is turned high and the signal PE remains low.

The count value of the counter 6 between time t1 and time t3 is output from the difference arithmetic unit 19a. The count value during the period is divided by N so that an approximate decimal phase difference can be acquired.

The signal PE between time t3 and time t4 is the phase difference in an amount that has not been detected between time t1 and time t3. The phase difference in the amount is detected between time t4 and time t5. The phase difference detected between time t4 and time t5 is output from the difference arithmetic unit 57a in the second phase difference arithmetic unit 57. The multiplier 57b multiplies the phase difference by $1/N^2$ so that a final decimal phase difference is detected by the third phase difference arithmetic unit 58.

In the example of FIG. 10, data C corresponding to the signal PE of the phase difference detected between time t1 and time t2, is detected so as to be (4−1)/4=0.75 between time t2 and time t3. Subsequently, data F corresponding to the signal PE of the phase difference detected between time t3 and time t4, is detected so as to be (7−5)/16=0.125 between time t4 and time t5. A different value (0.75−0.125=0.7375) between the values is output, as the final decimal phase difference, from the third phase difference arithmetic unit 58.

Similarly, data C corresponding to the signal PE of the phase difference detected between time t6 and time t7, is detected so as to be (15−11)/4=1.00 between time t7 and time t8. Subsequently, data F corresponding to the signal PE of the phase difference detected between time t8 and time t9, is detected so as to be (18−16)/16=0.125 between time t9 and time t10. A difference value (1.00−0.125)=0.875 between the values is output, as the final decimal phase difference, from the third phase difference arithmetic unit 58.

In this manner, according to the fifth embodiment, the processing of detecting the decimal phase difference is separated into two stages to be performed. The approximate decimal phase difference is detected at a first stage and the decimal phase difference in the amount that has not been detected at the first stage, is detected at a second stage. The phase difference is detected with the common first capacitor 23 and second capacitor 26 at each of the first stage and the second stage so that there is no risk that a hardware configuration is complicated. According to the present embodiment, the ratio N of the capacitance of the first capacitor 23 and the capacitance of the second capacitor 26 can be decreased so that time necessary for the first stage and the second stage, in more detail, the clock number of the oscillation signal of the DCO 3 at each of the first stage and the second stage can be reduced. As a result, the decimal phase difference having higher precision can be detected in a shorter time. For example, when a 16-staged decimal phase difference is detected, according to the first embodiment, the following expression is required to be satisfied, i.e. N=16. The capacitance of the second capacitor 26 is required to be large and additionally the clock number of the oscillation signal of the DCO 3 until the decimal phase difference is detected is required to be 16 at a maximum. However, according to the present embodiment, the following expression is only necessary, i.e. N=4. The capacitance of the second capacitor 26 can be reduced and additionally the clock number of the oscillation signal of the DCO 3 until the decimal phase difference is detected is only 4+4=8 clocks at a maximum. Accordingly, according to the present embodiment, the decimal phase difference can be detected with the second capacitor 26 having small capacitance with the precision remaining in a short time so that the reduction of the power consumption can be achieved.

Sixth Embodiment

Figure 11:
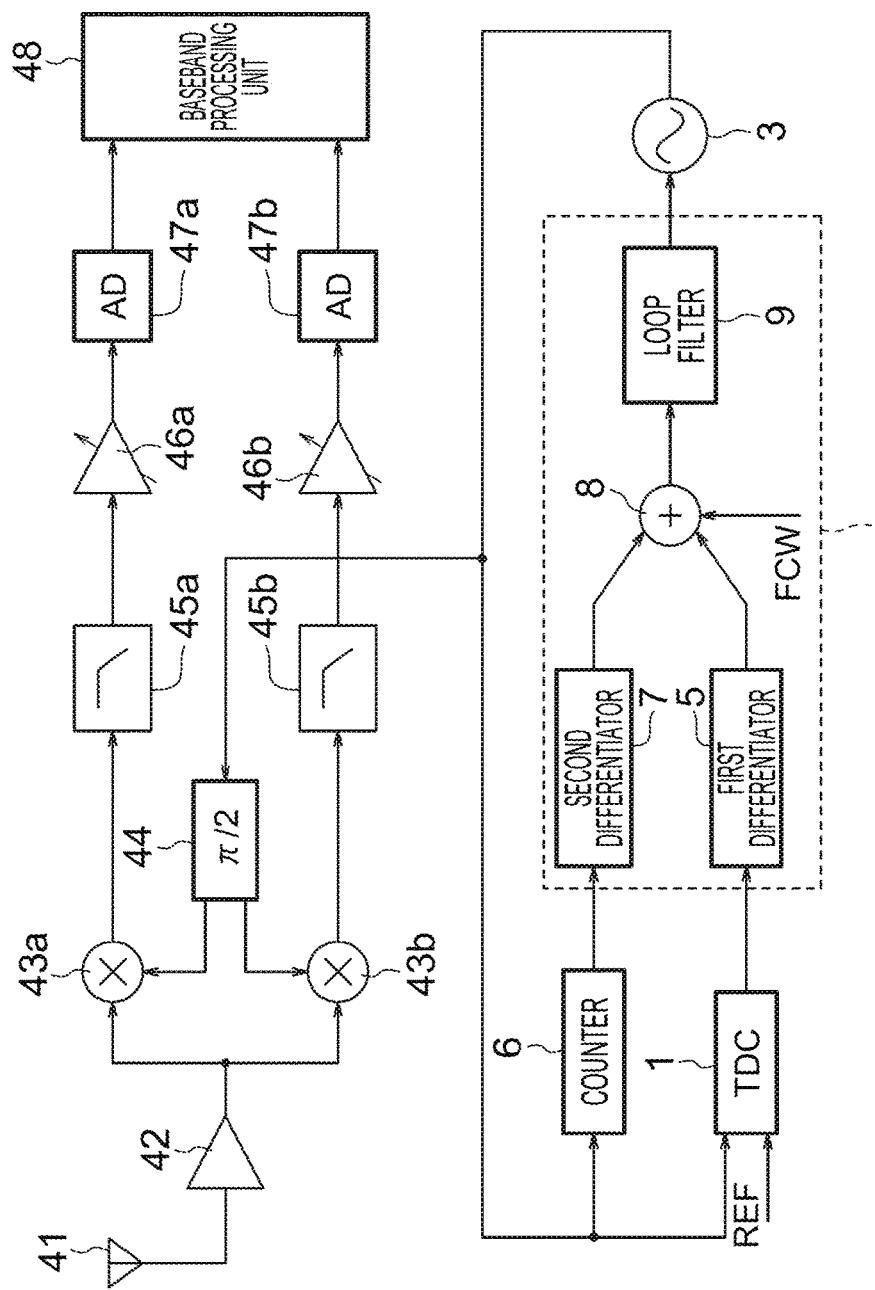
FIG. 11 is a block diagram of an internal configuration of a receiver having any of the TDCs according to the first to fifth embodiments.

Each of the TDCs 1 according to the first to fifth embodiments can be used for a receiver. FIG. 11 is a block diagram of an internal configuration of the receiver 40 having any one of the TDCs 1 according to the first to fifth embodiments.

The receiver 40 in FIG. 11 has an antenna 41, a local oscillator 2 having a configuration similar to that in FIG. 2, a high-frequency amplifier 42, quadrature demodulators 43a and 43b, a 90° phase shifter 44, low pass filters 45a and 45b, variable gain amplifiers (VGAs) 46a and 46b, A/D converters 47a and 47b, and a baseband processing unit 48.

The quadrature demodulators 43a and 43b generate an I signal and a Q signal out of phase with each other by 90°, respectively, based on a local oscillation signal output from the local oscillator 2 and a signal including the local oscillation signal shifted by a phase of 90° by the 90° phase shifter 44. The low pass filters 45a and 45b remove harmonic noise included in the I signal and the Q signal, respectively. The variable gain amplifiers 46a and 46b adjust gain of the I signal and the Q signal after the removal of the noise, respectively. The A/D converters 47a and 47b convert the I signal and the Q signal output from the variable gain amplifiers 46a and 46b into digital data and input the digital data to the baseband processing unit 48, respectively.

The receiver 40 can be used as a single body or can be used as a radio communication device including a transmitter.

Figure 12:
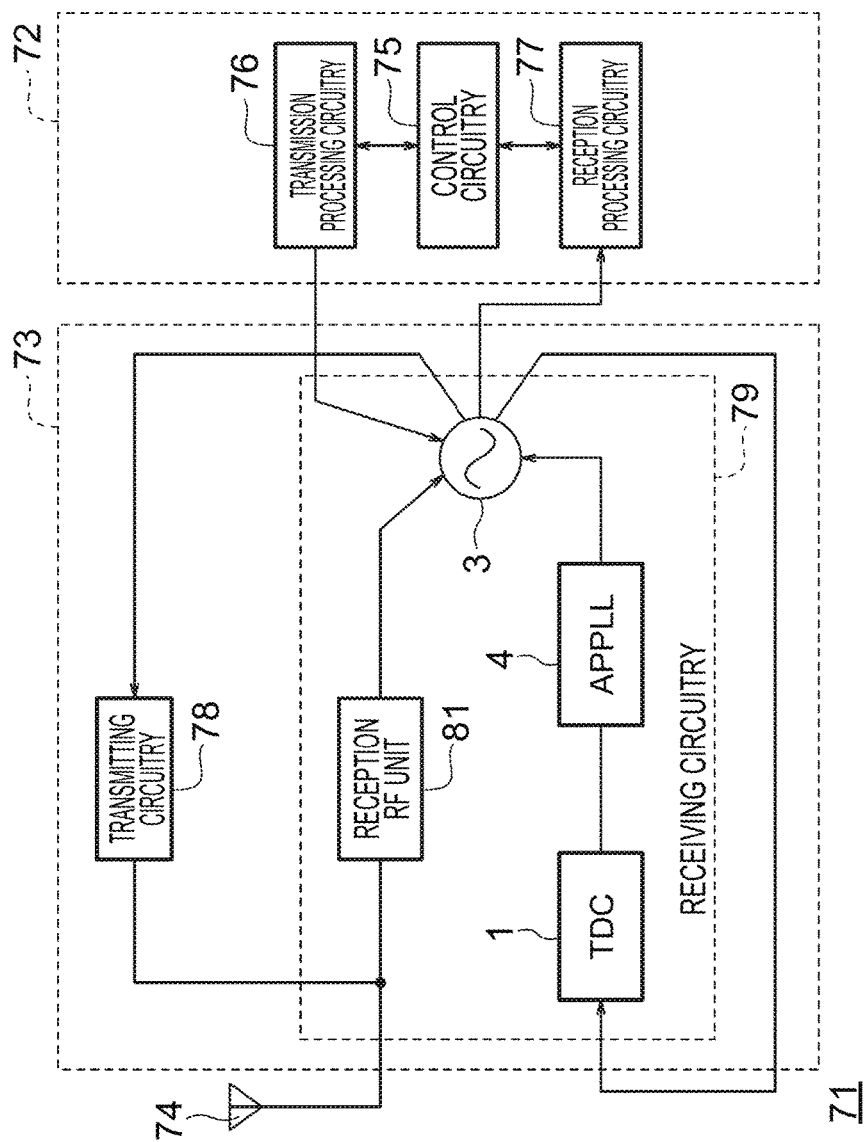
FIG. 12 is a block diagram of a schematic configuration of a radio communication device according to a sixth embodiment.

FIG. 12 is a block diagram of a schematic configuration of a radio communication device 71 according to a fifth embodiment.

The radio communication device 71 in FIG. 12 includes a baseband processing unit 72, an RF unit 73, and an antenna unit 74.

The baseband processing unit 72 has a control circuitry 75, a transmission processing circuitry 76, and a reception processing circuitry 77. Each of the circuitries in the baseband processing unit 72 performs digital signal processing.

The control circuitry 75 performs, for example, processing of a media access control (MAC) layer. The control circuitry 75 may perform processing of a host network hierarchy of the MAC layer. The control circuitry 75 may perform processing relating to multi-input multi-output (MIMO). For example, the control circuitry 75 may perform, for example, propagation path estimation processing, transmission weight calculation processing, and stream separation processing.

The transmission processing circuitry 76 generates a digital transmission signal. The reception processing circuitry 77 performs processing of analyzing a preamble and a physical header, for example, after performing demodulation and decoding.

The RF unit 73 includes a transmitting circuitry 78 and a receiving circuitry 79. The transmitting circuitry 78 includes a transmission filter not illustrated that extracts a signal in a transmission band, a mixer not illustrated that upconverts the signal that has passed through the transmission filter, into a radio frequency by using an oscillation signal of a DCO 3, and a preamplifier not illustrated that amplifies the signal that has been upconverted. The receiving circuitry 79 has a configuration similar to that of the receiver 40 in FIG. 11 described above. That is, the receiving circuitry 79 has a TDC 1, an ADPLL circuitry 4, a reception RF unit 81, and the DCO 3. The transmitting circuitry 78 and the receiving circuitry 79 in FIG. 12 share the DCO 3, but a separate DCO may be provided for each circuitry.

In a case where transmission and reception of a radio communication signal are performed through the antenna unit 74, a switch that couples any one of the transmitting circuitry 78 and the receiving circuitry 79, to the antenna unit 74, may be provided in the RF unit 73. When this type of switch is provided, the antenna unit 74 can be coupled to the transmitting circuitry 78 during the transmission, and the antenna unit 74 can be coupled to the receiving circuitry 79 during the reception.

Figure 13:
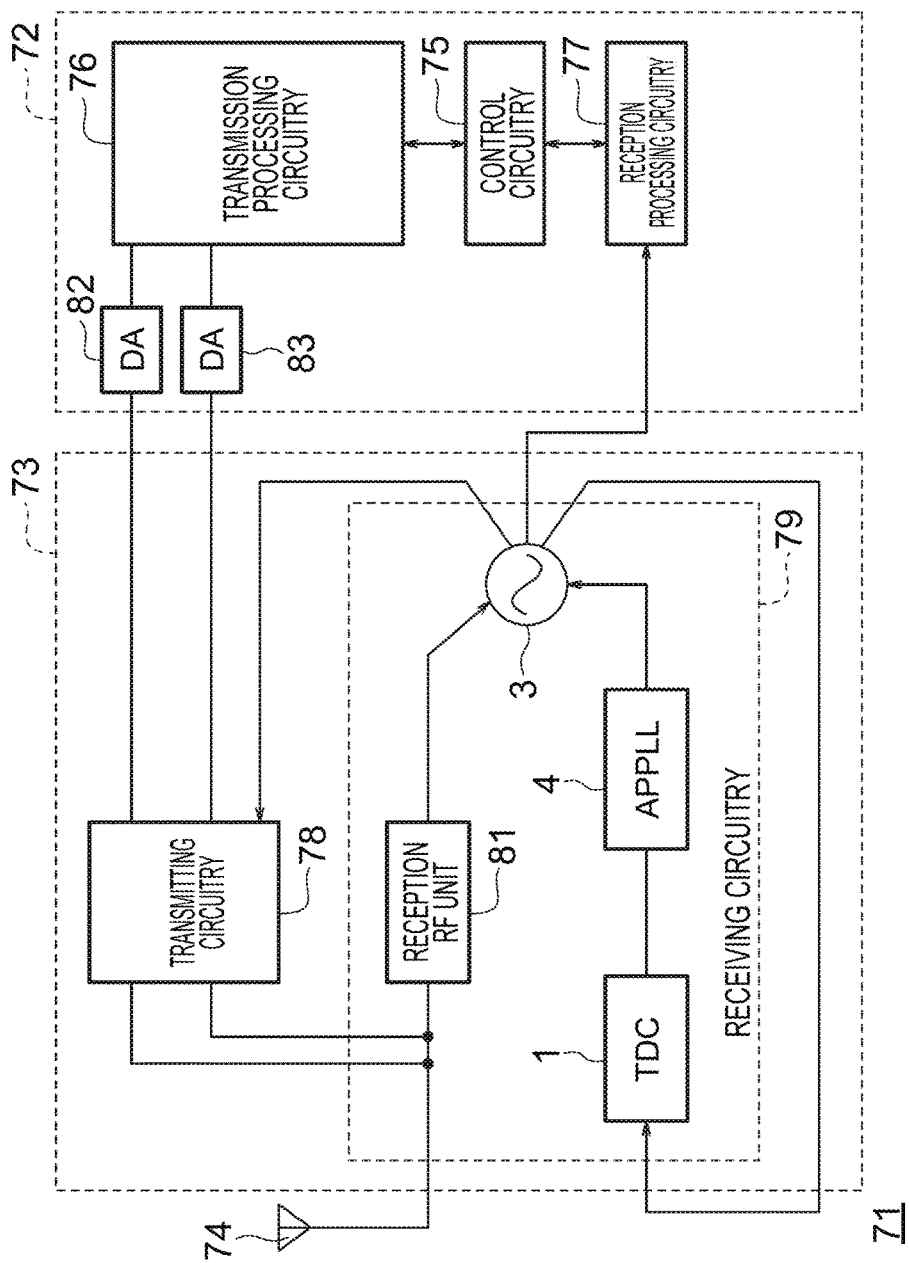
FIG. 13 is a block diagram of another configuration of the radio communication device.

The transmission processing circuitry 76 in FIG. 12 outputs only one-channel transmission signal, but may separately output an I signal and a Q signal in accordance with a radio communication system. A block diagram of a configuration of a radio communication device 71 in this case is, for example, illustrated in FIG. 13. The radio communication device 71 in FIG. 13 is different from that in FIG. 12 in terms of a configuration between the transmission processing circuitry 76 and the transmitting circuitry 78.

The transmission processing circuitry 76 generates a double-channel digital baseband signal (hereinafter, referred to as a digital I signal and a digital Q signal).

A DA conversion circuitry 82 that converts the digital I signal into an analog I signal, and a DA conversion circuitry 83 that converts the digital Q signal into an analog Q signal, are provided between the transmission processing circuitry 76 and the transmitting circuitry 78. The transmitting circuitry 78 upconverts the analog I signal and the analog Q signal by using a mixer not illustrated.

A reception RF unit 81 has the local oscillator 2, the high-frequency amplifier 42, the quadrature demodulators 43a and 43b, the 90° phase shifter 44, the low pass filters 45a and 45b, the variable gain amplifiers (VGAs) 46a and 46b, the A/D converters 47a and 47b, and the baseband processing unit 48 in FIG. 11.

The RF unit 73 and the baseband processing unit 72 illustrated in each of FIGS. 12 and 13 may be made on one chip, the RF unit 73 and the baseband processing unit 72 may be individually made on a separate chip. The RF unit 73 and the baseband processing unit 72 may partially include a discrete component, and the remaining may include one or a plurality of chips.

Furthermore, the RF unit 73 and the baseband processing unit 72 may include a software radio reconfigurable with software. In this case, a digital signal processing processor is used so that functions of the RF unit 73 and the baseband processing unit 72 are at least achieved with the software. In this case, a bus, the processor, and an external interface unit are provided inside the radio communication device 71 illustrated in each of FIGS. 12 and 13. The processor and the external interface unit are coupled through the bus, and firmware operates in the processor. The firmware can be updated with a computer program. The processor operates the firmware so that processing operations of the RF unit 73 and the baseband processing unit 72 illustrated in each of FIGS. 12 and 13 can be performed in the processor.

The radio communication devices 71 illustrated in FIGS. 12 and 13 include only the single antenna unit 74, but the number of the antennas is not particularly limited. For example, a transmission antenna unit 74 and a reception antenna unit 74 may be separately provided or an I signal antenna unit 74 and a Q signal antenna unit 74 may be separately provided. When only one antenna unit 74 is provided, a transmission-and-reception changeover switch at least switches the transmission and the reception.

The radio communication devices 71 illustrated in FIGS. 12 and 13 can be applied to a stationary radio communication device 71, such as an access point, a wireless router, or a computer, can be applied to a portable radio terminal, such as a smartphone or a mobile phone, can be applied to peripheral equipment, such as a mouse or a keyboard, that performs radio communication with a host device, can be applied to a card-typed member including a radio function built therein, or can be applied to a wearable terminal that performs radio communication of biological information. Various examples of a radio system of the radio communication between the radio communication devices 71 illustrated in FIG. 12 or 13 are not particularly limited, and are applicable to third generation or later cellular communication, a wireless LAN, Bluetooth (registered trademark), and near-field radio communication.

Figure 14:
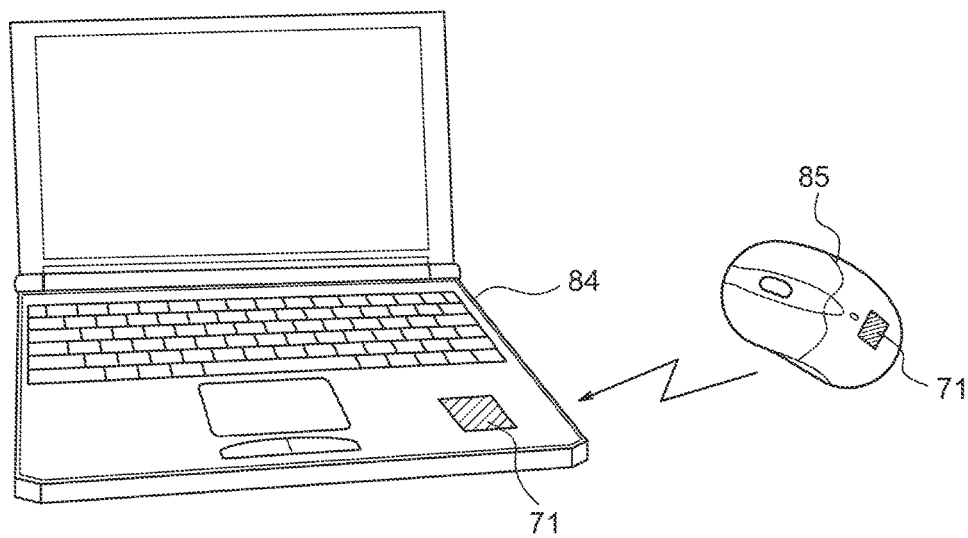
FIG. 14 is a view of an example of radio communication performed between a PC and a mouse.

FIG. 14 illustrates exemplary performance of radio communication between a PC 84 being a host device and a mouse 85 being peripheral equipment. Both of the PC 84 and the mouse 85 include the radio communication device 71 illustrated in FIG. 12 or 13 built therein. The mouse 85 uses power of a built-in battery so as to perform the radio communication, and is required to perform the radio communication with power consumption as low as possible because a space in which the battery is built is limited. Accordingly, using a radio system capable of low consumption radio communication, such as Bluetooth Low Energy decided in a standard of Bluetooth (registered trademark) 4.0, preferably performs the radio communication.

Figure 15:
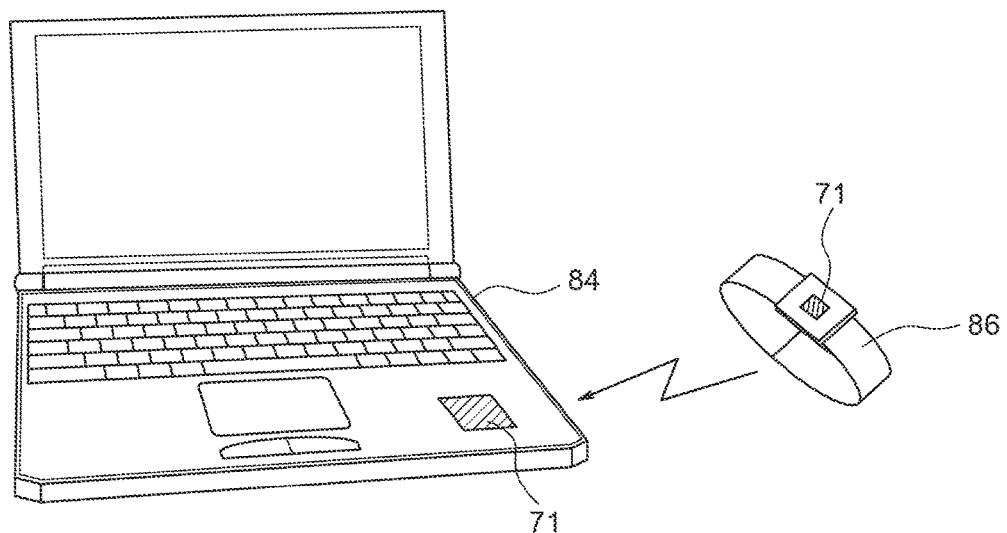
FIG. 15 is a view of an example of radio communication performed between a wearable terminal and a host device.

FIG. 15 illustrates exemplary performance of radio communication between a wearable terminal 86 and a host device (for example, the PC 84). The wearable terminal 86 is to be worn on a body of a person, and various examples thereof may include a seal type to be worn on a body, an eyeglasses type and an earphone type to be worn on a body except arms, and a pacemaker to be inserted inside a body, in addition to a type to be worn on an arm illustrated in FIG. 15. Both of the wearable terminal 86 and the PC 84 in FIG. 15 also include the radio communication device 71 illustrated in FIG. 12 or 13 built therein. Note that, examples of the PC 84 include a computer and a server. The above radio system capable of the radio communication with low power consumption, such as Bluetooth Low Energy, is also preferably adopted because the wearable terminal 86 is worn on a body of a person and a space for a built-in battery is limited.

When the radio communication is performed between the radio communication devices 71 illustrated in FIG. 12 or 13, the type of information to be transmitted and received through the radio communication is not limited. Note that, the radio system is preferably varied between a case where information including a large amount of data, such as moving image data, is transmitted and received and a case where information including a small amount of data, such as operation information of the mouse 85, is transmitted and received. Thus, there is a need to perform the radio communication in an optimum radio system in response with the amount of information to be transmitted and received.

Furthermore, when the radio communication is performed between the radio communication devices 71 illustrated in FIG. 12 or 13, a notifying unit that notifies a user of an operation state of the radio communication, may be provided. Specific examples of the notifying unit may include display of the operation state on a display device including LEDs, notification of the operation state by vibration of a vibrator, and notification of the operation state from audio information by a speaker or a buzzer.

The TDCs 1 and the receiver 40 described in the embodiments described above, may at least partially include hardware or include software. When the configuration including the software is provided, a program for achieving functions of the at least partial TDCs 1 and the receiver 40 may be stored in a storage medium, such as a flexible disk or a CD-ROM, and then may be read and performed by a computer. The storage medium is not limited to a detachably attachable storage medium, such as a magnetic disk or an optical disc, and may be a non-removable storage medium, such as a hard disk or a memory.

The program for achieving the functions of the at least partial TDCs 1 and the receiver 40, may be distributed through a communication line, such as the Internet, (including radio communication). Furthermore, the program that has been encrypted, modulated, or compressed, may be distributed through a wired line or a wireless line, such as the Internet, or may be stored in a storage medium and then may be distributed.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A time to digital converter comprising:
    a counter to measure the number of cycles of a first signal;
    a first phase difference detector to generate a phase difference signal having a pulse width corresponding to a phase difference between the first signal and a second signal having a frequency twice or more lower than the frequency of the first signal;
    a first capacitor to be charged with an electric charge corresponding to the pulse width of the phase difference signal;
    a second capacitor including capacitance N times the capacitance of the first capacitor, the N being a real number larger than 1;
    a comparator to compare a charge voltage of the first capacitor and a charge voltage of the second capacitor;
    a first charge controller to continue to charge the second capacitor until the comparator detects that the charge voltage of the second capacitor has reached the charge voltage of the first capacitor or more; and
    the first phase difference detector to detect the phase difference between the first signal and the second signal, based on a value obtained by dividing a count value of the counter during a period of the charge to the second capacitor by the N.

2. The time to digital converter according to claim 1, further comprising:
    a first current source to supply a charge current to the first capacitor and the second capacitor;
    a first selector to switch whether the charge current is supplied from the first current source to the first capacitor, due to the phase difference signal; and
    a second selector to switch whether the charge current is supplied from the first current source to the second capacitor, due to a signal from the first charge controller.

3. The time to digital converter according to claim 1, further comprising:
    a discharge controller to discharge the first capacitor and the second capacitor when the comparator detects that the charge voltage of the second capacitor has reached the charge voltage of the first capacitor or more.

4. The time to digital converter according to claim 3, wherein the discharge controller comprises:
    a third selector to make a short circuitry between both electrodes of the first capacitor so as to discharge the first capacitor, due to a signal from the first charge controller; and
    a fourth selector to make a short circuitry between both electrodes of the second capacitor so as to discharge the second capacitor, due to the signal from the first charge controller.

5. The time to digital converter according to claim 1, wherein the first charge controller charges the first capacitor during time corresponding to the pulse width of the phase difference signal.

6. The time to digital converter according to claim 1, further comprising:
    first retain circuitry to retain the count value of the counter at a point in time when the charge of the second capacitor is started;

second retain circuitry to retain the count value of the counter at a point in time when the comparator detects that the charge voltage of the second capacitor has reached the charge voltage of the first capacitor or more; and a difference detector to detect a count value of a difference between the count value of the second retain circuitry and the count value of the first retain circuitry, wherein the first phase difference detector divides the count value operated by the difference detector, by the N so as to operate the phase difference.

7. The time to digital converter according to claim 1, wherein the first phase difference detector comprises:

first synchronizing circuitry to synchronize the second signal at a rising edge or falling edge of the first signal;

m-staged second synchronizing circuitry coupled in series, the m-staged second synchronizing circuitry to latch an output signal of the first synchronizing circuitry or an output signal at a front stage, at the same rising edge or falling edge of the first signal as the first synchronizing circuitry, the m being an integer of 1 or more; and a first logic detector to detect the phase difference signal based on the output signal of the first synchronizing circuitry and an output signal of the second synchronizing circuitry.

8. The time to digital converter according to claim 7, further comprising:

a precharge signal generator to generate a precharge signal having a pulse width corresponding to time necessary for passing the second signal through the m-staged second synchronizing circuitry; and a charge reinforce circuitry to reinforce a charge current to the second capacitor during time corresponding to the pulse width of the precharge signal after the charge to the second capacitor is started.

9. The time to digital converter according to claim 8, wherein the precharge signal generator comprises:

m-staged third synchronizing circuitry to latch the output of the first synchronizing circuitry or the output at the front stage, at the same rising edge or falling edge of the first signal as the first synchronizing circuitry; and a second logic detector to generate the precharge signal, based on the output signal of the first synchronizing circuitry and an output signal of the third synchronizing circuitry.

10. The time to digital converter according to claim 8, further comprising:

a first current source to supply a charge current to the first capacitor and the second capacitor, wherein the charge reinforce circuitry comprises a second current source that supplies the charge current to the second capacitor, and the charge current supplied from the second current source to the second capacitor is K times the charge current supplied from the first current source to the second capacitor, the K being a real number more than 1 and smaller than the N.

11. The time to digital converter according to claim 1, further comprising:

a second phase difference detector to generate a phase difference signal having a pulse width corresponding to the phase difference between the first signal and the second signal at a point in time when the comparator detects that the charge voltage of the second capacitor has reached the charge voltage of the first capacitor or more due to the continuous charge of the first charge controller to the second capacitor;

a second charge controller to continue to charge the second capacitor until the comparator again detects that the charge voltage of the second capacitor has reached the charge voltage of the first capacitor or more after the first capacitor is charged based on the pulse width of the phase difference signal detected by the second phase difference detector;

a second phase difference detector to detect the phase difference between the first signal and the second signal, with a value obtained by dividing the count value of the counter during the period of the charge to the second capacitor, by the N squared; and a third phase difference detector to detect a decimal phase difference between the first signal and the second signal, based on the phase difference operated by the first phase difference detector and the phase difference operated by the second phase difference detector.

12. The time to digital converter according to claim 1, further comprising:

an integrated circuitry including the counter, the first phase difference detector, the first capacitor, the second capacitor, the comparator, the first charge controller, and the first phase difference detector.

13. The time to digital converter according to claim 12, further comprising:

the integrated circuitry; and at least one antenna.

14. A radio communication device comprising:

RF circuitry; and baseband circuitry, wherein the RF circuitry comprises a transmitter and a receiver, the baseband circuitry comprises transmission processing circuitry and reception processing circuitry, the receiver comprises:

an oscillator to generate an oscillation signal in accordance with a phase difference;

a time to digital converter to detect the phase difference between the oscillation signal and a reference signal;

PLL circuitry to feed back the oscillation signal so that the phase difference becomes zero; and reception RF circuitry to perform reception processing by using the oscillation signal, wherein the time to digital converter comprises:

a counter to measure the number of cycles of a first signal;

a first phase difference detector to generate a phase difference signal having a pulse width corresponding to a phase difference between the first signal and a second signal having a frequency twice or more lower than the frequency of the first signal;

a first capacitor to be charged with an electric charge corresponding to the pulse width of the phase difference signal;

a second capacitor including capacitance N times the capacitance of the first capacitor, the N being a real number larger than 1;

a comparator to compare a charge voltage of the first capacitor and a charge voltage of the second capacitor;

a first charge controller to continue to charge the second capacitor until the comparator detects that the charge voltage of the second capacitor has reached the charge voltage of the first capacitor or more; and the first phase difference detector to detect the phase difference between the first signal and the second signal, based on a value obtained by dividing a count value of the counter during a period of the charge to the second capacitor by the N.

15. The radio communication device according to claim 14, further comprising:
    a first current source to supply a charge current to the first capacitor and the second capacitor;
    a first selector to switch whether the charge current is supplied from the first current source to the first capacitor, due to the phase difference signal; and
    a second selector to switch whether the charge current is supplied from the first current source to the second capacitor, due to a signal from the first charge controller.

16. The radio communication device according to claim 14, further comprising:
    a discharge controller to discharge the first capacitor and the second capacitor when the comparator detects that the charge voltage of the second capacitor has reached the charge voltage of the first capacitor or more.

17. The radio communication device according to claim 16,
    wherein the discharge controller comprises:
        a third selector to make a short circuitry between both electrodes of the first capacitor so as to discharge the first capacitor, due to a signal from the first charge controller; and
        a fourth selector to make a short circuitry between both electrodes of the second capacitor so as to discharge the second capacitor, due to the signal from the first charge controller.

18. The radio communication device according to claim 14,
    wherein the first charge controller charges the first capacitor during time corresponding to the pulse width of the phase difference signal.

19. The radio communication device according to claim 14, further comprising:
    a first retainer to retain the count value of the counter at a point in time when the charge of the second capacitor is started;
    a second retainer to retain the count value of the counter at a point in time when the comparator detects that the charge voltage of the second capacitor has reached the charge voltage of the first capacitor or more; and
    a difference detector to detect a count value of a difference between the count value of the second retainer and the count value of the first retainer,
    wherein the first phase difference detector divides the count value operated by the difference detector, by the N so as to operate the phase difference.

20. A time to digital converter comprising:
    a counter to count a number of cycles of a first signal;
    a phase difference detector to generate a phase difference signal corresponding to a phase difference between the first signal and a second signal, wherein a frequency of the first signal and a frequency the second signal are different;
    a first capacitor charged with an electric signal corresponding to the phase difference signal;
    a second capacitor having N times capacitance of the first capacitor, the N being a real number larger than 1, wherein the second capacitor is charged until a charge voltage of the second capacitor has reached a charge voltage of the first capacitor or more; and
    the phase difference detector to detect the phase difference between the first signal and the second signal, based on dividing a count number of the counter by the N.

* * * * *